United States Patent
Tsai et al.

(10) Patent No.: US 10,879,400 B2
(45) Date of Patent: Dec. 29, 2020

(54) FIELD EFFECT TRANSISTOR AND METHOD OF MANUFACTURING THE SAME

(71) Applicant: Taiwan Semiconductor Manufacturing Co., Ltd., Hsinchu (TW)

(72) Inventors: Kuo-Chiang Tsai, Hsinchu (TW); Jyh-Huei Chen, Hsinchu (TW); Fu-Hsiang Su, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 16/231,616

(22) Filed: Dec. 24, 2018

(65) Prior Publication Data

US 2020/0203531 A1 Jun. 25, 2020

(51) Int. Cl.
| | |
|---|---|
| *H01L 29/66* | (2006.01) |
| *H01L 21/768* | (2006.01) |
| *H01L 21/265* | (2006.01) |
| *H01L 27/088* | (2006.01) |
| *H01L 29/08* | (2006.01) |
| *H01L 29/78* | (2006.01) |
| *H01L 21/033* | (2006.01) |

(52) U.S. Cl.
CPC ...... *H01L 29/7851* (2013.01); *H01L 21/0337* (2013.01); *H01L 21/76829* (2013.01); *H01L 29/0847* (2013.01); *H01L 29/6656* (2013.01); *H01L 29/66795* (2013.01); *H01L 2029/7858* (2013.01)

(58) Field of Classification Search
CPC ............. H01L 29/41791; H01L 29/785; H01L 29/4232; H01L 29/66795; H01L 29/7855
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |

(Continued)

*Primary Examiner* — Brian Turner
(74) *Attorney, Agent, or Firm* — JCIPRNET

(57) ABSTRACT

Field effect transistor and manufacturing method thereof are disclosed. Field effect transistor includes a substrate, a fin, spacers, a gate structure, a hard mask pattern, an insulating layer, and a gate contact. The fin protrudes from the substrate and extends in a first direction. The spacers run in parallel over the fin and extending in a second direction perpendicular to the first direction. The gate structure extends between the spacers and covers the fin. The hard mask pattern covers the gate structure and extends in between the spacers. The insulating layer is disposed over the substrate and covers the hard mask pattern, the gate structure and the spacers. The gate contact penetrates the insulating layer and physically contacts the gate structure. A bottom surface of the gate contact is coplanar with top surfaces of the spacers and the hard mask pattern.

20 Claims, 21 Drawing Sheets

(56) References Cited

U.S. PATENT DOCUMENTS

| | | | |
|---|---|---|---|
| 9,576,814 B2 | 2/2017 | Wu et al. | |
| 2014/0077305 A1* | 3/2014 | Pethe | H01L 21/76897 |
| | | | 257/368 |
| 2015/0287721 A1* | 10/2015 | Cheng | H01L 27/0886 |
| | | | 257/190 |
| 2016/0079354 A1* | 3/2016 | Park | H01L 27/0886 |
| | | | 257/386 |
| 2017/0110549 A1* | 4/2017 | Xie | H01L 27/0886 |
| 2017/0288031 A1* | 10/2017 | Ho | H01L 29/66545 |
| 2018/0261596 A1* | 9/2018 | Jun | H01L 27/0886 |

\* cited by examiner

FIELD EFFECT TRANSISTOR AND METHOD OF MANUFACTURING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Challenges from both fabrication and design issues have resulted in the development of three-dimensional designs, such as fin field-effect transistors (FinFETs).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 6A show schematic perspective views of a structure produced during a manufacturing method of a FinFET according to some embodiments of the present disclosure.

FIG. 1B to FIG. 6B show schematic cross-sectional views of structures produced during a manufacturing method of a FinFET according to some embodiments of the present disclosure. The cross-sectional views of FIG. 1B to FIG. 6B are taken along the line I-I shown in FIG. 1A.

FIG. 1C to FIG. 6C show schematic cross-sectional views of structures produced during a manufacturing method of a FinFET according to some embodiments of the present disclosure. The cross-sectional views of FIG. 1C to FIG. 6C are taken along the line II-II of FIG. 1A.

DETAILED DESCRIPTION

Figure 1A:
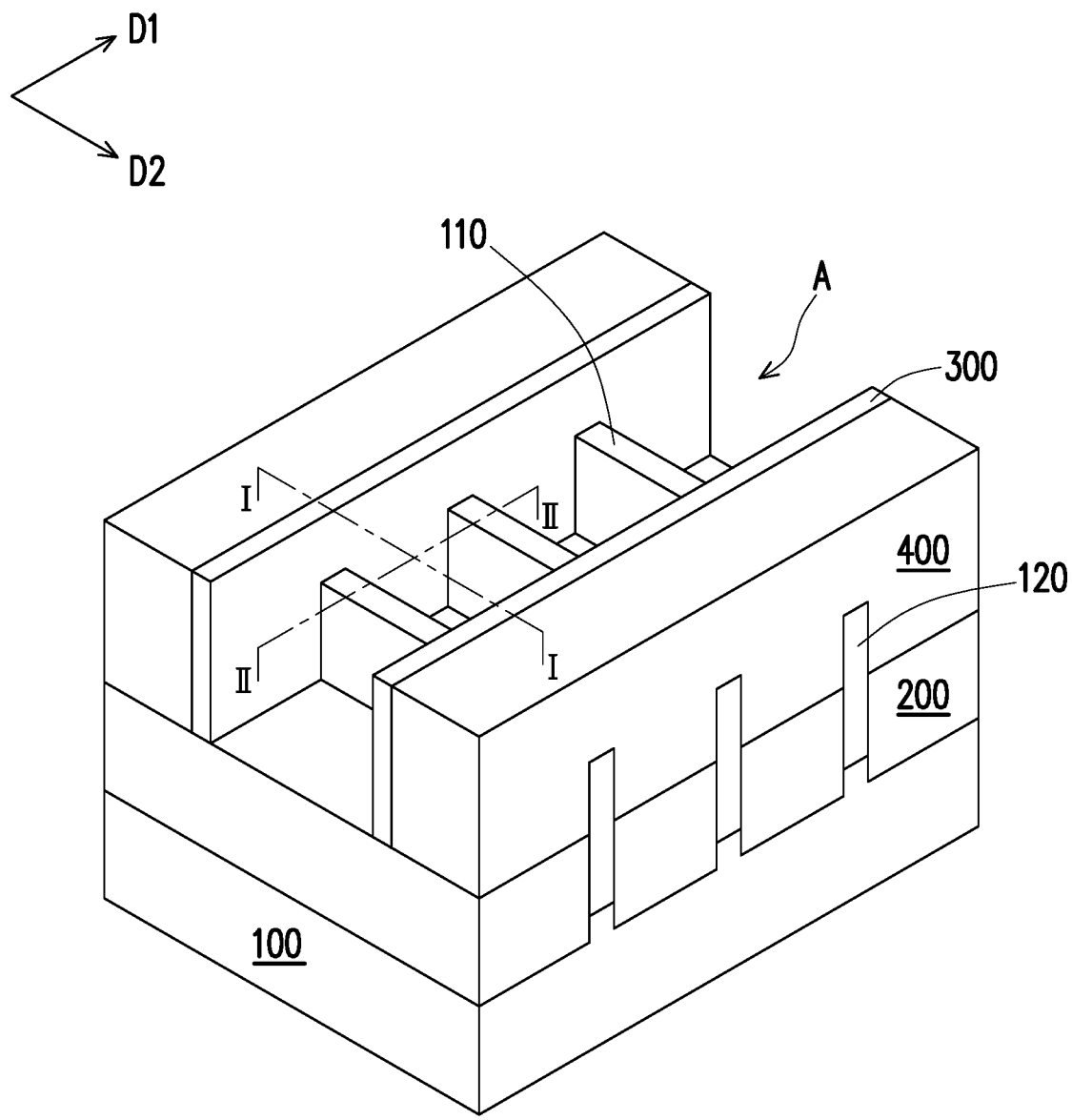

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the disclosure describe the exemplary manufacturing process of FinFETs and the FinFETs fabricated there-from. In certain embodiments of the disclosure, the FinFET may be formed on bulk silicon substrates. Still, the FinFET may be formed on a silicon-on-insulator (SOI) substrate, a germanium-on-insulator (GOI) substrate, a SiGe substrate, or a Group III-V semiconductor substrate. Also, in accordance with some embodiments of the disclosure, the silicon substrate may include other conductive layers or other semiconductor elements, such as transistors, diodes or the like. The embodiments are not limited in this context. Other transistor structures, such as gate-all-around (GAA) field effect transistors, are within the contemplated scope of the disclosure. The field effect transistor may be included in a microprocessor, memory cell, and/or other integrated circuits (IC). In addition, the transistors of the present disclosure may be further processed using CMOS technology processing. Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a field effect transistor, it is understood the field effect transistor may be part of an IC that further includes a number of other devices such as resistors, capacitors, inductors, fuses, etc.

FIG. 1A to FIG. 6A are perspective views of structures produced during a manufacturing process of a FinFET 10 (shown in FIG. 8A) according to some embodiments of the disclosure. FIG. 1B to FIG. 6B and FIG. 1C to FIG. 6C are cross-sectional views of the structure shown in the corresponding figures labelled with A along the lines I-I and II-II of FIG. 1A, respectively. Referring to FIG. 1A, FIG. 1B and FIG. 1C, a semiconductor substrate 100 is provided. In some embodiments, the semiconductor substrate 100 includes a crystalline silicon substrate or a bulk silicon substrate (e.g., wafer). The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the semiconductor substrate 100 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate.

Figure 1B:
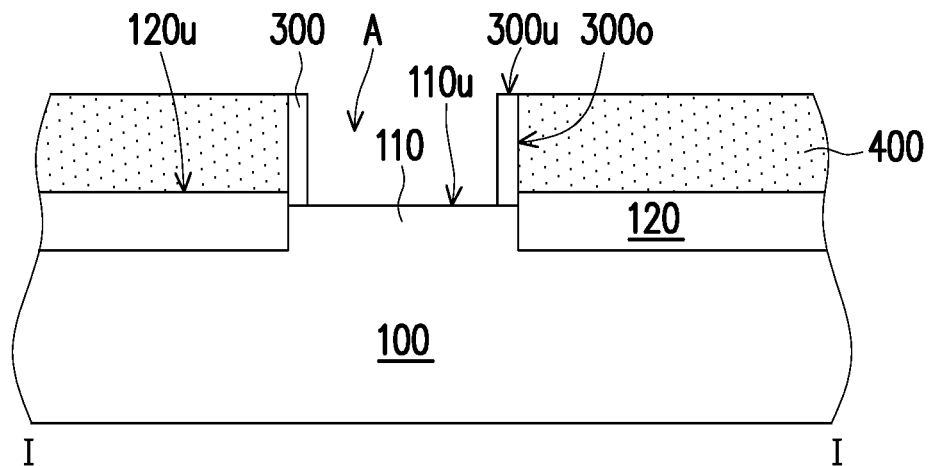
Figure 1C:
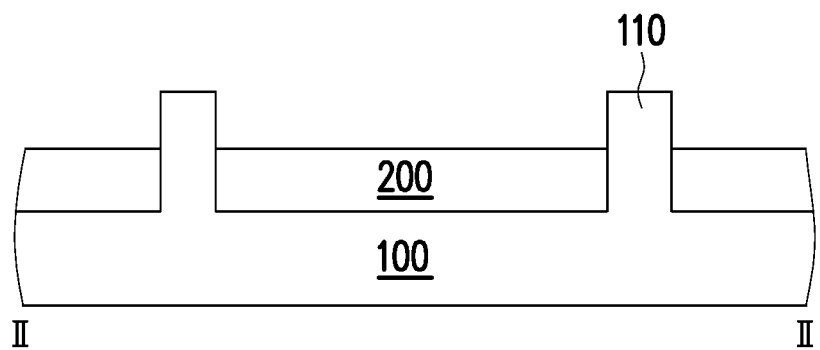

As shown in FIG. 1A and FIG. 1C, at least one fin 110 is formed on and/or in the substrate 100. In some embodiments, portions of the substrate 100 are removed to define the fins 110 protruding from the substrate 100. In some embodiments, the substrate 100 and the fins 110 are integrally formed, that is, there is no boundary between the substrate 100 and the individual fins 110. However, other techniques for fabricating the fins 110 are possible. In some embodiments, the substrate 100 and the fins 110 are made of a same material. In some embodiments, multiple fins 110 are arranged along a first direction D1. In some embodiments, for each of the fins 110 a width along a second direction D2 is larger than a thickness along the first direction D1. In some embodiments, a spacing of the fins 110 along the first direction D1 may be adjusted according to production and design requirements.

In some embodiments, as shown in FIG. 1A and FIG. 1C, isolation structures 200 are formed between the fins 110. In some embodiments, the isolation structures 200 are shallow trench isolation (STI) structures. The isolation structures 200 are interposed between adjacent fins 110. The isolation structures 200 may be formed by filling a trench defined by adjacent fins 110 with a dielectric material. In some embodiments, the dielectric material may include silicon oxide, silicon nitride, silicon oxynitride, fluoride-doped silicate glass (FSG), a spin-on dielectric material, a low-k dielectric material, other suitable dielectric materials or a combination thereof. In some embodiments, low-k dielectric materials are dielectric materials having a dielectric constant lower than 3.9. The isolation structures 200 may be formed by high-density-plasma chemical vapor deposition (HDP-CVD), sub-atmospheric CVD (SACVD) or by spin-on. In some embodiments, the isolation structures 200 may have a multi-layered structure, such as a thermal oxide liner layer filled with silicon nitride or silicon oxide. In some embodiments, the isolation structures 200 are local oxidation of silicon (LOCOS).

Figure 1D:
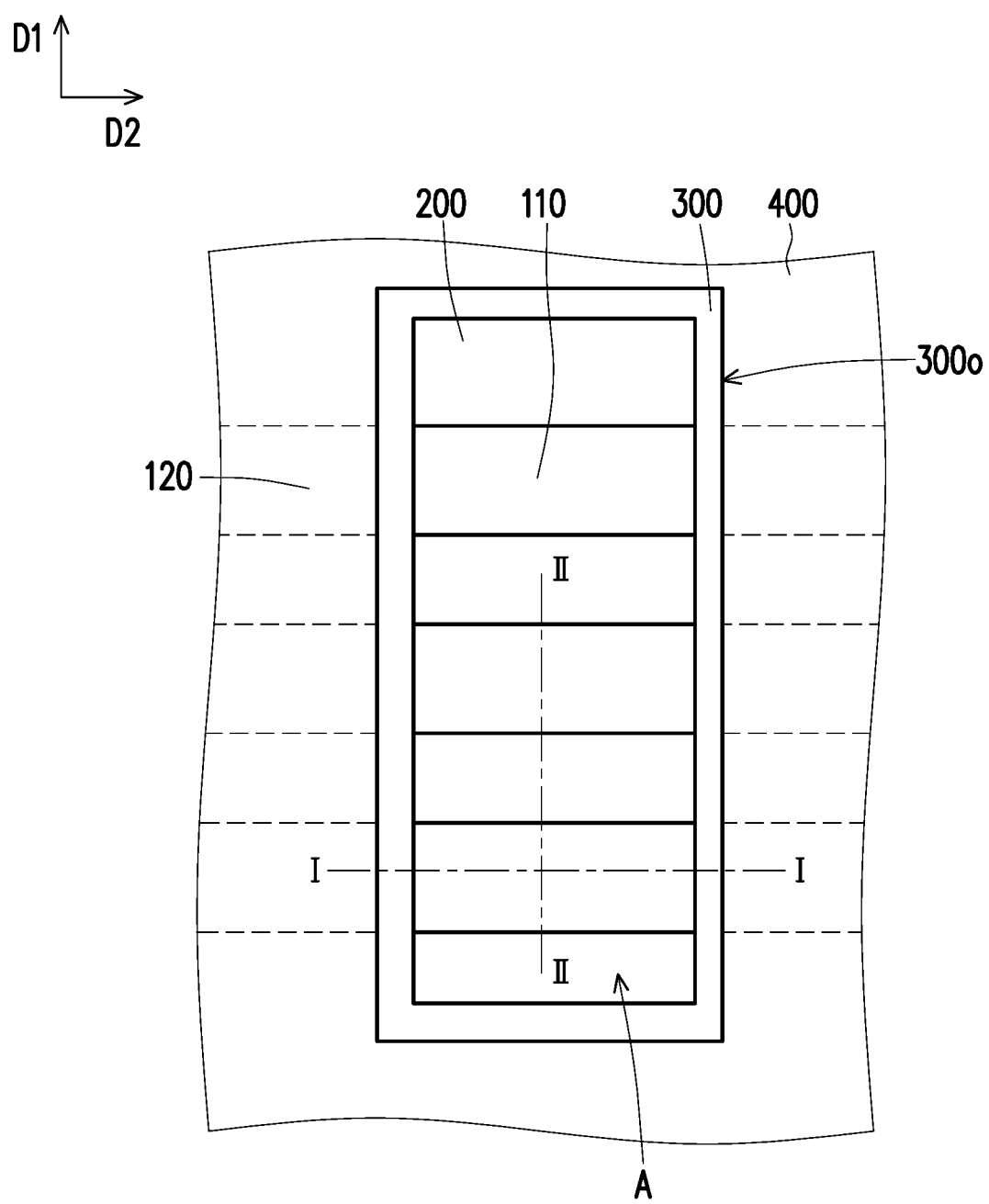
FIG. 1D shows a schematic top view of a structure produced during a manufacturing method of a FinFET according to some embodiments of the present disclosure.

In some embodiments, spacers 300 are formed on the isolation structures 200 and over the fins 110. Referring to FIG. 1A and FIG. 1B, the spacers 300 extends over multiple fins 110 along the first direction D1. In some embodiments, a pair of parallel spacers 300 delimits an enclosure A exposing a central portion of the fins 110. In some embodiments, the spacers 300 are formed of dielectric materials, such as silicon oxide, silicon nitride, carbonized silicon nitride (SiCN), SiCON, or a combination thereof. In some embodiments, the spacers 300 are a single-layered structure. In some alternative embodiments, the spacers 300 are a multi-layered structure. FIG. 1D is a schematic top view of a structure corresponding to the manufacturing stage shown in FIG. 1A according to some embodiments of the disclosure. As shown in FIG. 1D, in some embodiments, the pair of parallel spacers 300 is connected at opposite line-ends and forms a ring structure or an enclosed wall structure defining the enclosure A in which the fins 110 and the isolation structures 200 are exposed. It should be noted that whilst in FIG. 1D only three fins 110 are shown to be comprised within the enclosure A, the disclosure is not limited by the number of fins 110 encircled by the spacers 300. In some alternative embodiments, more or fewer fins 110 may be exposed within the same enclosure A. In some embodiments, the enclosure A may be formed by removing a temporary dummy gate (not shown) formed during previous steps of the process. As shown in FIG. 1D, the source and drain regions 120 are located outside of the enclosure A defined by the spacers 300. It should be noted that whilst in FIG. 1D only one enclosure A (subsequently gate structure formed therein) is shown, more than one enclosure A (i.e. more than one gate structure) may be formed over multiple fins.

Referring to FIG. 1A and FIG. 1B, in some embodiments, the source or drain regions 120 of the transistor are formed in/on the fin 110 at opposite sides outside the spacers. In one exemplary embodiment as shown in FIG. 1D, one of the two regions 120 at the opposite ends of each fin 110 acts as a source region, and the other region 120 acts as a drain region. In some embodiments, the source/drain regions 120 are disposed in the fins 110. In some embodiments, a silicide layer (not shown) is selectively formed on an upper surface 120u of the source and drain regions 120. In some embodiments, the source and drain regions 120 are further epitaxially grown in recesses formed at the sides of each fin 110. In some embodiments, as shown in FIG. 1B, the source and drain regions 120 protrude with respect to the fin 110. That is, the upper surface 120u of a source or drain region 120 may be raised with respect to an upper surface 110u of the adjacent fin 110. In some embodiments, the source and drain regions 120 may be epitaxially grown to have protruded shapes or diamond shapes. In some embodiments, a material of the source and drain regions 120 is different than a material of the fin 110 sandwiched in between. In some embodiments, the material of the source and drain regions 120 is doped with a conductive dopant. For example, a strained material, such as SiGe, is epitaxially grown with a p-type dopant for straining a p-type FinFET. That is, the strained material is doped with the p-type dopant to be the source and drain regions 120 of the p-type FinFET. The p-type dopant includes boron or $BF_2$, and the strained material may be epitaxially grown by LPCVD process with in-situ doping. In some alternative embodiments, the strained material, such as SiC, SiP, a combination of SiC/

SiP, or SiCP, is epitaxially grown with an n-type dopant for straining an n-type FinFET. That is, the strained material is doped with the n-type dopant to be the source and drain regions 120 of the n-type FinFET. The n-type dopant includes arsenic and/or phosphorus, and the strained material may be epitaxially grown by LPCVD process with in-situ doping. It should be noted that the material within the source and drain regions 120 may be disposed as a single-layered structure or a multi-layered structure, with different layers having different degrees of doping.

Referring to FIG. 1A to FIG. 1D, a first interlayer dielectric layer 400 is disposed over the source and drain regions 120 and the isolation structures 200 surrounding the spacers 300 and the enclosure A. In other words, the first interlayer dielectric layer 400 is formed adjacent to the spacers 300, outside of the spacers 300 and outside the enclosure A. In some embodiments, a material of the first interlayer dielectric layer 400 includes low-k dielectric materials. Examples of low-k dielectric materials include BLACK DIAMOND® (Applied Materials of Santa Clara, Calif.), Xerogel, Aerogel, amorphous fluorinated carbon, parylene, BCB (bis-benzo-cyclobutenes), flare, SILK® (Dow Chemical, Midland, Mich.), hydrogen silsesquioxane (HSQ), fluorinated silicon oxide (SiOF), or a combination thereof. It is understood that the first interlayer dielectric layer 400 may include one or more dielectric materials or one or more dielectric layers. In some embodiments, the first interlayer dielectric layer 400 is formed to a suitable thickness by flowable CVD (FCVD), CVD, HDPCVD, SACVD, spin-on, sputtering, or other suitable methods. For example, an interlayer dielectric material layer (not shown) may be initially formed to cover the isolation structures 200, the source and drain regions 120, the spacers 300, and the temporary gate (not shown) formed in between the spacers 300. Subsequently, a thickness of the interlayer dielectric material layer is reduced until top surfaces 300u of the spacers 300 are exposed, so as to form the first interlayer dielectric layer 400. The thickness of the interlayer dielectric material layer may be adjusted via a chemical mechanical polishing (CMP) process, an etching process, or other suitable processes. The first interlayer dielectric layer 400 faces an outer sidewall 300o of the spacers 300, so that within the enclosure A delimited by the spacers 300 the isolation structures 200 or the fins 110 are exposed, as shown in FIG. 1C. In some embodiments, portions of the spacers 300 (and the temporary gate disposed in between) may also be removed when removing interlayer dielectric material layer to form the first interlayer dielectric layer 400, so that top surfaces 300u of the spacers 300 are substantially flush with the top surface of the first interlayer dielectric layer 400.

Figure 2A:
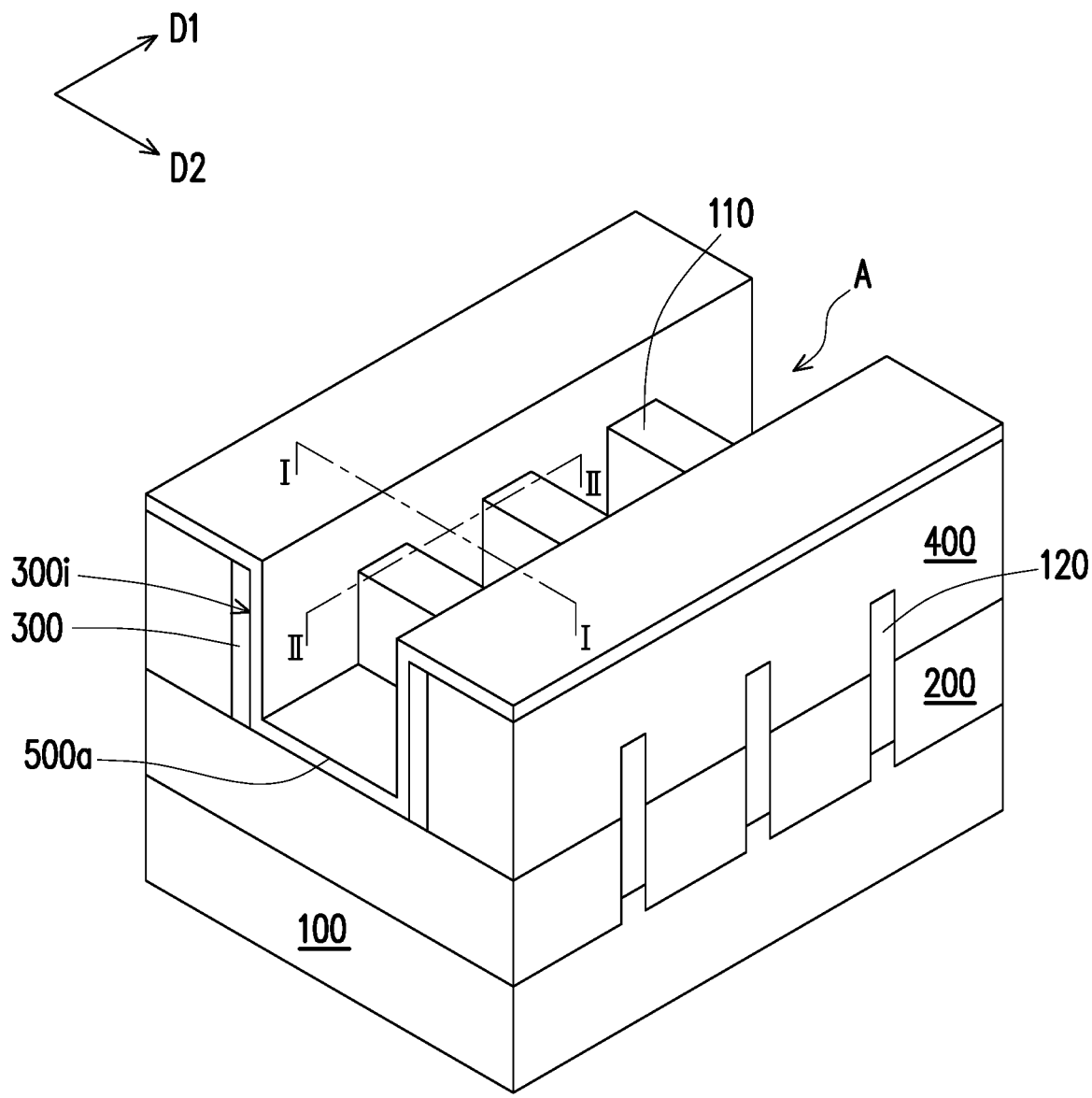
Figure 2B:
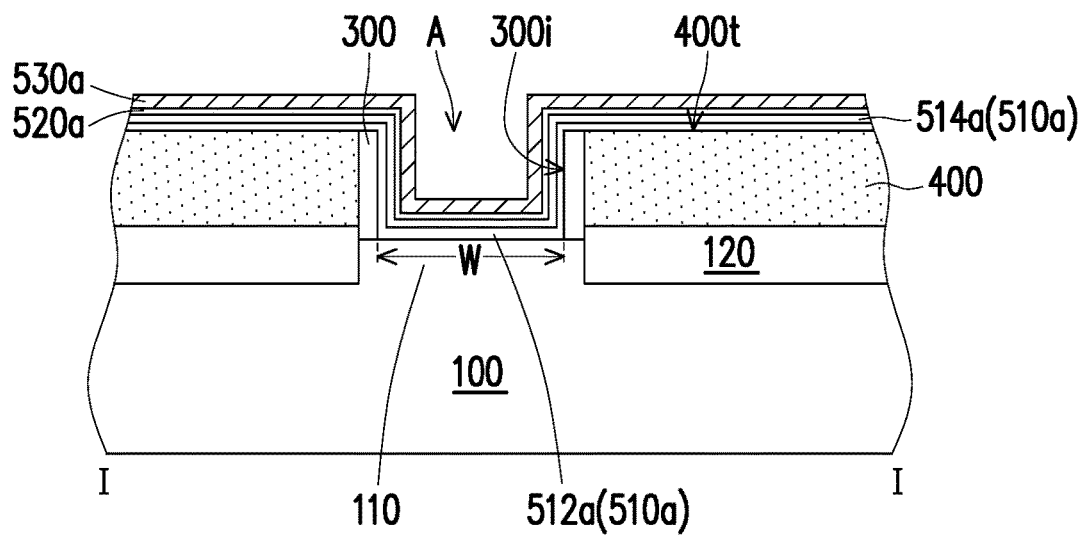
Figure 2C:
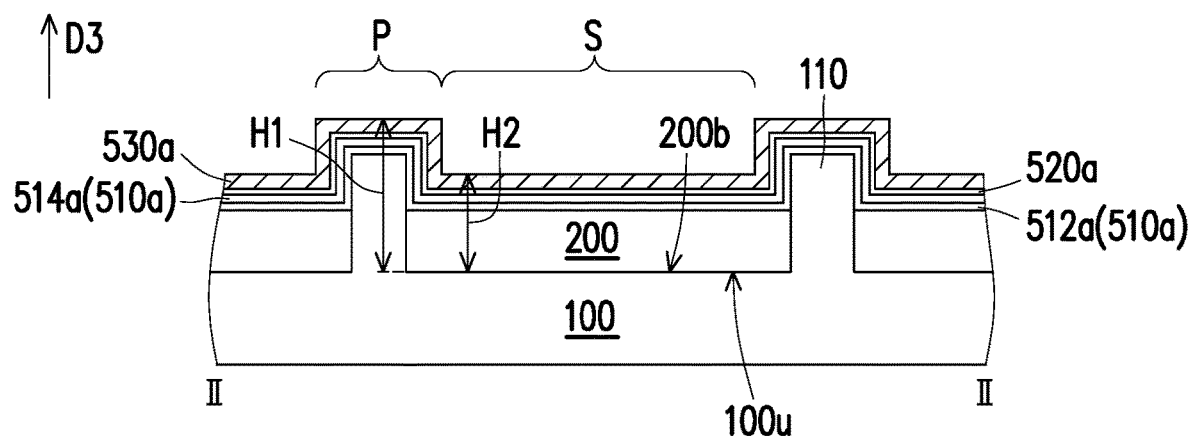

Referring to FIG. 2A to FIG. 2C, in some embodiments, a gate blanket structure 500a is formed over exposed fins 110 and the isolation structures 200 disposed in between the fins 110 in the enclosure A. In some embodiments, the gate blanket structure 500a extends within the enclosure A, and further extends over the spacers 300 and the first interlayer dielectric layer 400 outside of the enclosure A. In some embodiments, the gate blanket structure 500a contacts the fins 110 and the isolation structures 200 within the enclosure A, and further contacts the inner sidewalls 300i of the spacers 300 and the top surface 400t of the first interlayer dielectric layer 400. In some embodiments, the gate blanket structure 500a is conformally disposed over the fins 110 and the isolation structures 200 within the enclosure A. In some embodiments, as shown in FIG. 2C, a profile of the gate blanket structure 500a is uneven within the enclosure A. That is, moving along the first direction D1, the gate blanket structure 500a presents protruding portions P alternating with sunken portions S. The protruding portions P are formed when the gate blanket structure 500a passes over the fins 110, whilst the sunken portions S correspond to the regions where the gate blanket structures 500a extends over the isolation structures 200. In other words, the gate blanket structure 500a reaches a first height H1 in the protruding portions P and a second height H2 in the sunken portions S. Within the present disclosure, the heights H1 and H2 are measured as vertical distances (along the direction D3 shown in FIG. 2C) from the plane defined by an upper surface 100u of the substrate 100 (excluding the fins), or, equivalently, a plane defined by a bottom surface 200b of the isolation structures 200. In some embodiments, the unevenness of the profile between sunken portions S and protruding portion P is accentuated for wider gate blanket structures 500a. In some embodiments, a width W of the gate blanket structure 500a is defined as a distance between opposite inner sidewalls 300i of the spacers 300 along the second direction D2.

In some embodiments, the width W of the gate blanket structure 500a is greater than 20 nm, but the disclosure is not limited thereto. In some embodiments, as shown in FIG. 2A and in FIG. 2B, the gate blanket structure 500a is disposed within the enclosure A without entirely filling it.

In some embodiments, the gate blanket structure 500a is formed by sequential deposition of multiple layers, as described in some detail below. In some embodiments, the gate blanket structure 500a includes a gate dielectric material layer 510a, a work function material layer 520a, and a gate electrode material layer 530a. In some embodiments, the gate dielectric material layer 510a may include an oxide interface material layer 512a and a high-k dielectric material layer 514a. In some alternative embodiments, the oxide interface material layer 512a may be omitted.

The oxide interface material layer 512a may include a dielectric material such as silicon oxide or silicon oxynitride (SiON). In some embodiments, the oxide interface material layer 512a may be formed by a deposition process such as atomic layer deposition (ALD), chemical vapor deposition (CVD), and/or other suitable deposition methods. In some alternative embodiments, the oxide interface material layer 512a may be formed on an exposed portion of the fin 110 through an oxidation process. For example, the fin 110 may be oxidized with a wet process or via thermal oxidation. When the oxide interface material layer 512a is formed by an oxidation process, the oxide interface material layer 512a may exhibit a different profile than the one illustrated in FIG. 2B and FIG. 2C. In some embodiments, the oxide interface material layer 512a may provide increased adhesion between the semiconductor surface (i.e., the fins 110) and the high-k material layer 514a.

In some embodiments, the high-k material layer 514a is formed over the oxide interface material layer 512a. In some embodiments, as shown in FIG. 2B, the oxide interface material layer 512a may further extend between the high-k material layer 514a and the spacers 300. In some alternative embodiments, the high-k material layer 514a physically contacts the spacer 310. In some embodiments, the high-k material layer 514a has a dielectric constant greater than about 4, greater than about 12, greater than about 16, or even greater than about 20. For example, a material of the high-k material layer 514a may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof, or other suitable materials. In some alternative embodiments, the material of the high-k material layer 514a may optionally include a silicate such as HfSiO, HfSiON LaSiO, AlSiO, or a combination thereof. In some embodiments, the method of forming the high-k material layer 514a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, the work function material layer 520a is formed over the gate dielectric layer 510a. A material of the work function material layer 520a may be selected according to the conductivity type desired for the transistor. Exemplary p-type work function materials that may be included in the work function material layer 520a include TiN, TaN, Ru, Mo, Al, WN, $ZrSi_2$, $MoSi_2$, $TaSi_2$, $NiSi_2$, WN, other suitable p-type work function materials, or combinations thereof. On the other hand, exemplary n-type work function materials that may be included in the work function material layer 520a include Ti, Ag, TaAl, TaAlC, TiAlN, TaC, TaCN, TaSiN, Mn, Zr, other suitable n-type work function materials, or combinations thereof. In some embodiments, the method of forming the work function material layer 520a includes performing at least one suitable deposition technique, such as CVD, PECVD, ALD, RPALD, PEALD, MBD, or the like. In some embodiments, the work function material layer 520a serves the purpose of adjusting a threshold voltage of the transistor.

In some embodiments, the gate electrode material layer 530a is formed over the work function material layer 520a. In some embodiments, a material of the gate electrode material layer 530a includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some alternative embodiments, the gate blanket structure 500a may further include barrier layers, work function layers, liner layers, interface layers, seed layers, adhesion layers, etc.

Figure 3A:
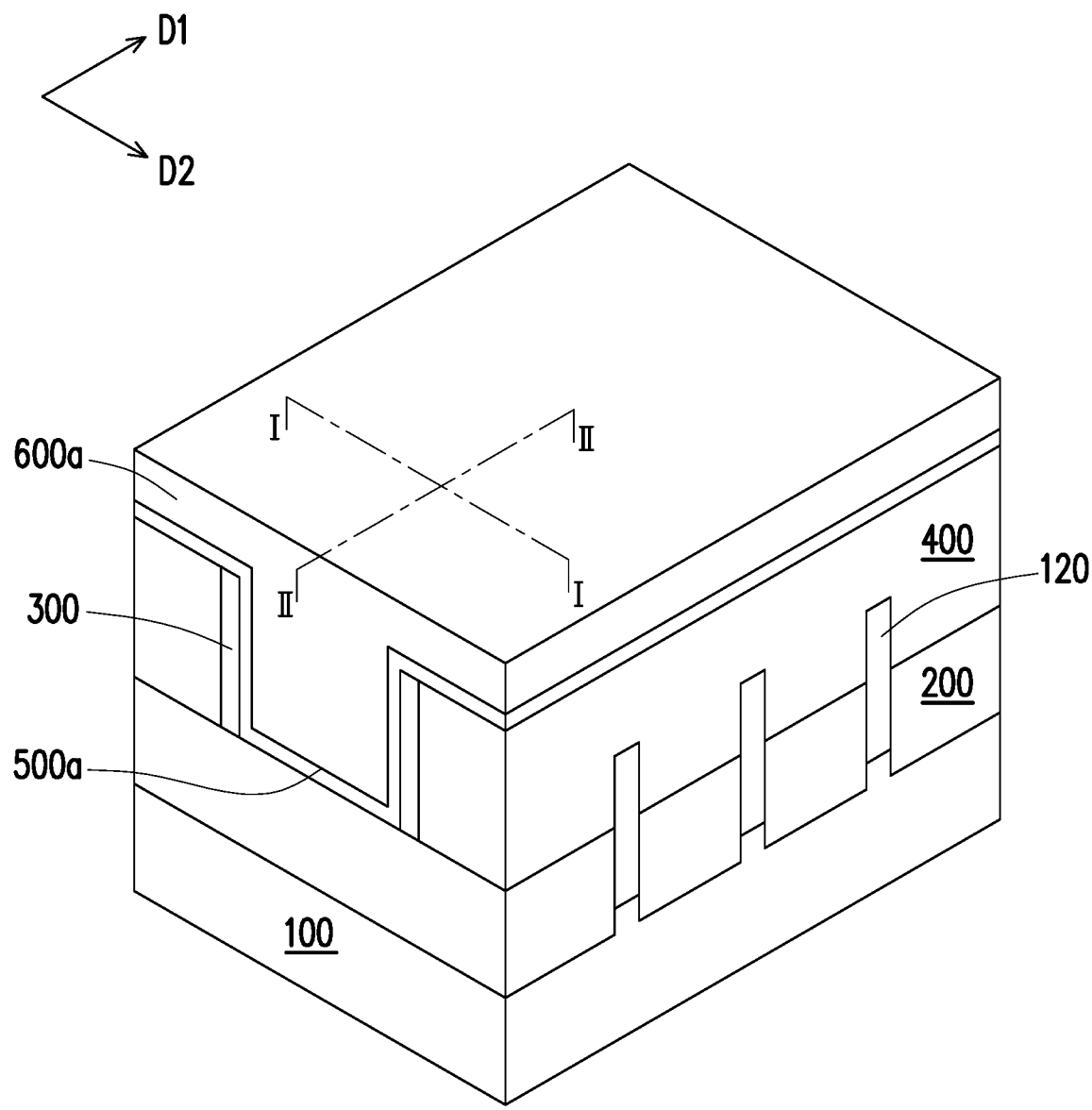
Figure 3B:
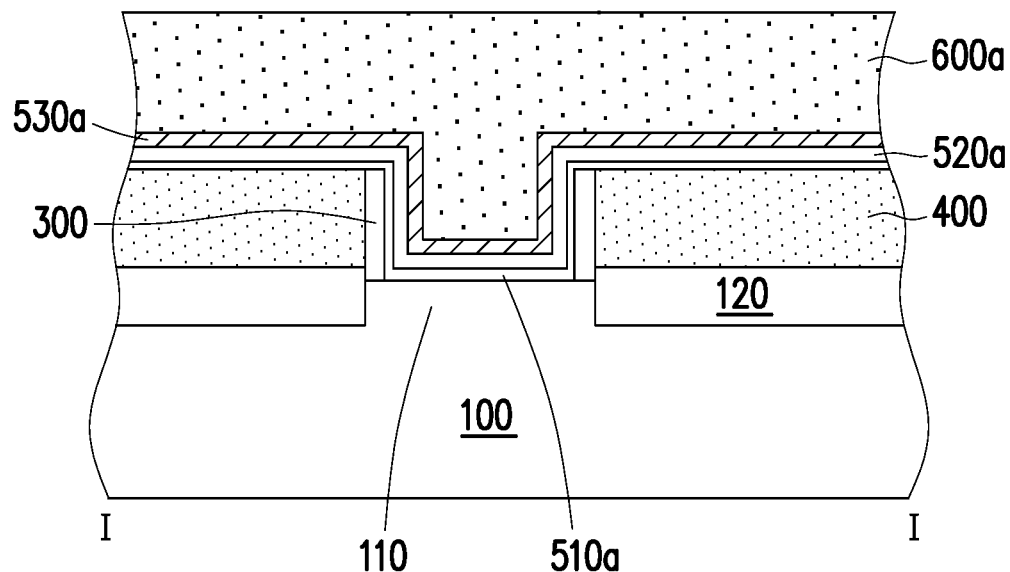
Figure 3C:
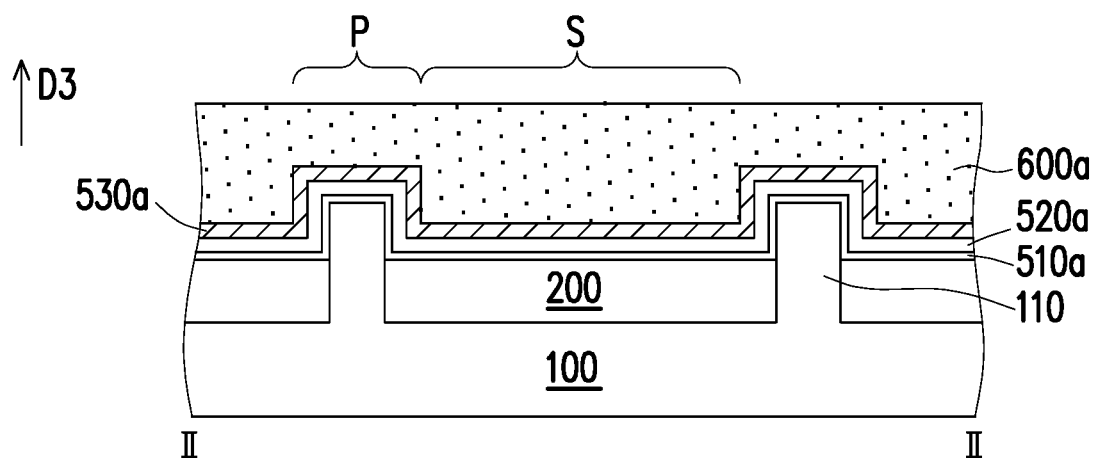

Referring to FIG. 3A to FIG. 3C, a second interlayer dielectric material layer 600a is formed covering the gate blanket structure 500a. In FIG. 3A to FIG. 3C, for simplification, the gate dielectric material layer 510a is shown. Even though the gate dielectric material layer 510a is shown as a single layer, the gate dielectric material layer 510a may include an oxide interface material layer 512a and a high-k dielectric material layer 514a. As shown in FIG. 3A, the second interlayer dielectric material layer 600a may completely fill the enclosure A (shown in FIG. 1A) and may further extend over the first interlayer dielectric layer 400 and the spacers 300. Portions of the gate blanket structure 500a may be interposed between the second interlayer dielectric material layer 600a and the spacers 300 or the first interlayer dielectric layer 400, as shown in FIG. 3A and FIG. 3B. As shown in FIG. 3C, the second interlayer dielectric material layer 600a may extend over the protruding portions P and the sunken portion S, compensating the height difference between the two portions P and S and filling the space of the sunken portions S in between the protruding portion P. In some embodiments, a material of the second interlayer dielectric material layer 600a includes a low-k dielectric material. In some embodiments, the material of the second interlayer dielectric material layer 600a is different from the material of the first interlayer dielectric layer 400. In some embodiments, selective etching is possible between the second interlayer dielectric material layer 600a and the first interlayer dielectric layer 400. For example, the second interlayer dielectric material layer 600a may function as a hard mask material covering the gate blanket structure 500a. In some embodiments, the second interlayer dielectric material layer 600a is formed with methods similar to what previously discussed for the first interlayer dielectric layer 400 with reference to FIG. 1A to FIG. 1D, and a detailed description is omitted for the sake of brevity.

Figure 4A:
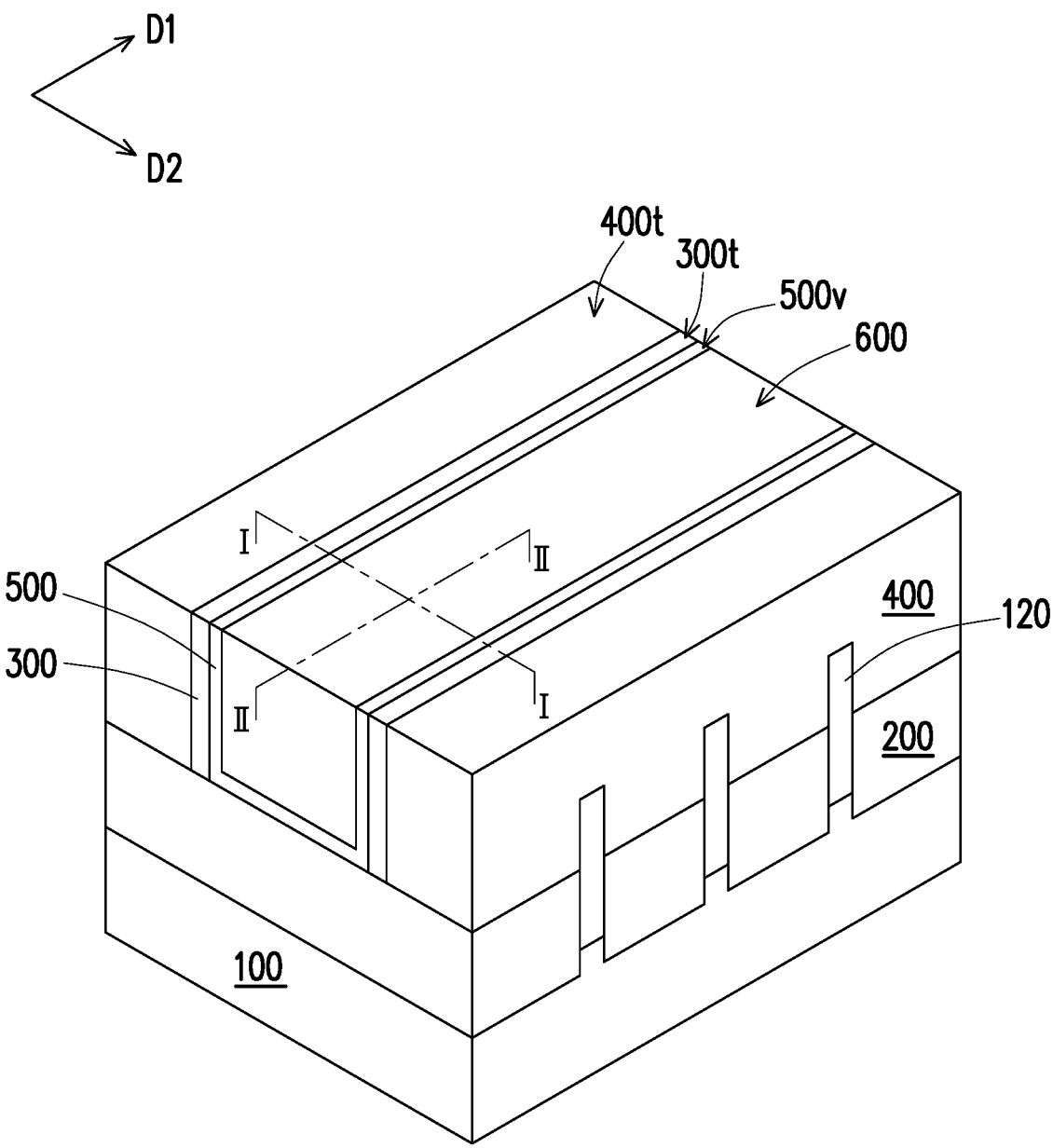
Figure 4B:
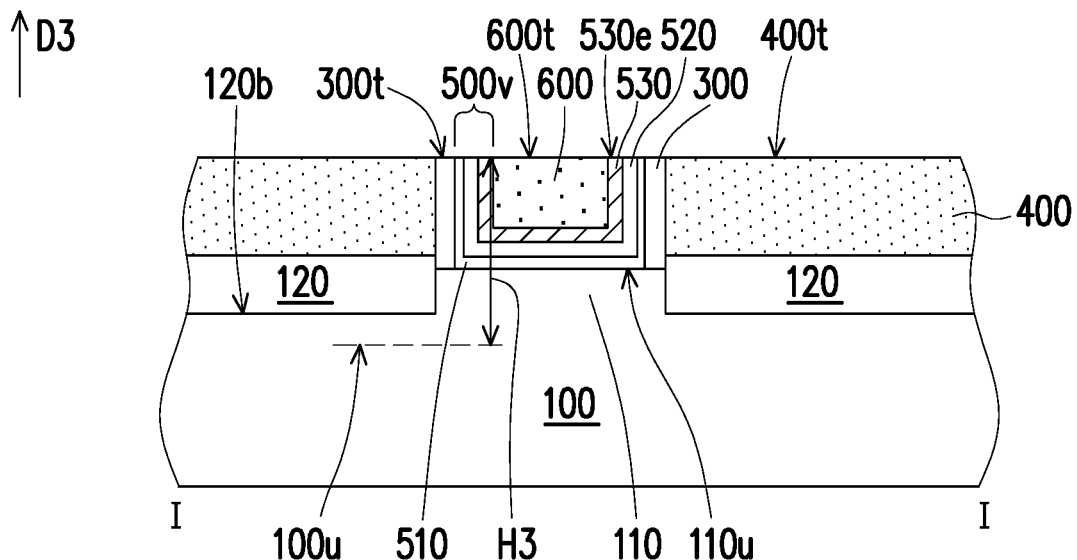
Figure 4C:
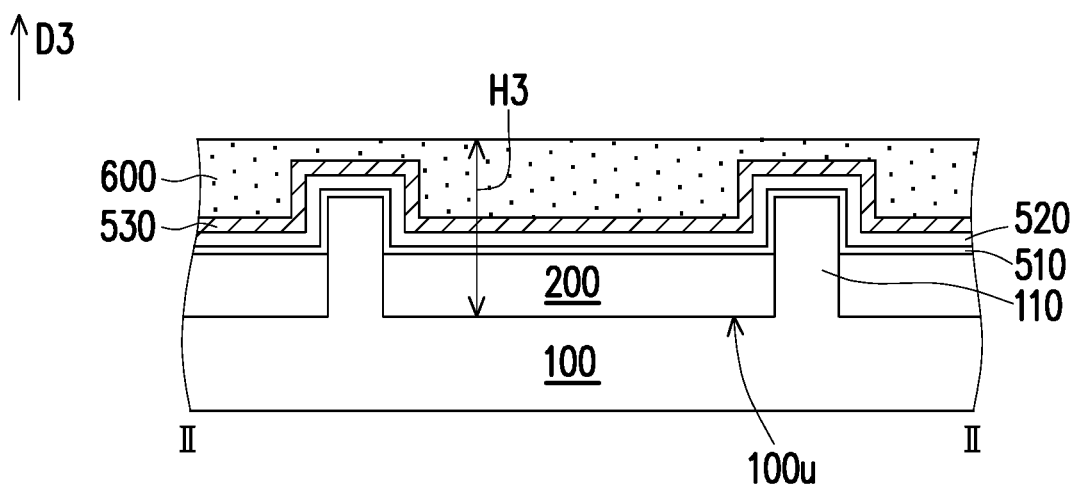

Referring to FIG. 3A to FIG. 3C and to FIG. 4A to FIG. 4C, a planarization process is performed, portions of the second interlayer dielectric material layer 600a and portions of the gate blanket structure 500a are removed until the top surfaces 300t of the spacers 300 and top surfaces 400t of the first interlayer dielectric layer 400 are exposed, thus forming a second interlayer dielectric layer 600 and a gate structure 500. To this end, a chemical mechanical polishing (CMP) process or an etching process may be performed. As shown in FIG. 4B, following the planarization process, top surfaces 300t of the spacers 300 may be substantially flush with the top surface 400t of the first interlayer dielectric layer 400, an exposed region 500v of the gate structure 500, and a top surface 600t of the second interlayer dielectric layer 600. In one embodiment, the second interlayer dielectric layer 600 functions as the hard mask for the gate structure 500. In some embodiments, the exposed region 500v of the gate structure 500 includes at least an end portion 530e of the gate electrode layer 530. That is, following the planarization process, the gate electrode layer 530 is partially exposed, at least along the spacers 300. In other words, following the planarization process, the exposed region 500v of the gate structure 500 is the region of the gate structure 500 extending on the inner sidewall 300i of the spacers 300. In some embodiments, the exposed region 500v is the only region of the gate structure 500 that emerges from below the second interlayer dielectric layer 600, and is sandwiched between the spacers 300 and the second interlayer dielectric layer 600. Referring to FIG. 4A, the gate structure 500 is exposed all along the spacers 300, independently of whether the gate structure 500 is located over the fins 110 or over the isolation structures 200. However, other portions of the gate electrode layer 530 covering the fins 110 and isolation structures 200 are buried underneath the second interlayer dielectric layer 600. In other words, the gate structure 500 may surround the second interlayer dielectric layer 600, so that the second interlayer dielectric layer 600 may be entrenched within the gate structure 500. It should be noted that the entire enclosure A (shown in FIG. 1D) is not fully illustrated in the perspective views, and the spacers 300 extending along the second direction D2 (and completing the enclosure A) are omitted for clarity purpose. As shown in FIG. 4A and FIG. 4C, further away from the spacers 300, the gate structure 500 is covered by the second interlayer dielectric layer 600, independently of whether the gate structure 500 runs over the fins 110 or the isolation structures 200. In some embodiments, as the spacers 300 is shaped as a ring structure or an enclosed wall structure defining the enclosure A (as shown in FIG. 1D), the gate structure 500 that is formed along the inner sidewalls 300i of the spacers 300 and covering the fins 110 and the isolation structures 200 within the enclosure A is shaped as a box structure (i.e. with a top view as a ring shape exposed from the second interlayer dielectric layer 600), and the second interlayer dielectric layer 600 fills up the box structure. Through the planarization process, the second interlayer dielectric layer 600 filled in the box-shaped gate structure 500 is formed as a strip or a block structure in a self-aligned way. In some embodiments, the exposed region 500v of the gate structure 500 extending on the inner sidewall 300i of the spacers 300 reaches a third height H3 that is smaller than the first height H1 (illustrated in FIG. 2C) and greater than the second height H2 (illustrated in FIG. 2C). Within the present disclosure, the third height H3 is measured as a vertical distance (along the direction D3 shown in FIG. 4B) from the plane defined by the upper surface 100u of the substrate 100 (excluding the fins), or, equivalently, the plane defined by the bottom surface 200b of the isolation structures 200. As shown in FIG. 4C, as the exposed region 500v of the gate structure 500 may be substantially flush with the top surface 600t of the second interlayer dielectric layer 600, the vertical distance along the direction D3 from the plane defined by the upper surface 100u of the substrate 100 to the top surface 600t is substantially equivalent to the third height H3.

Figure 5A:
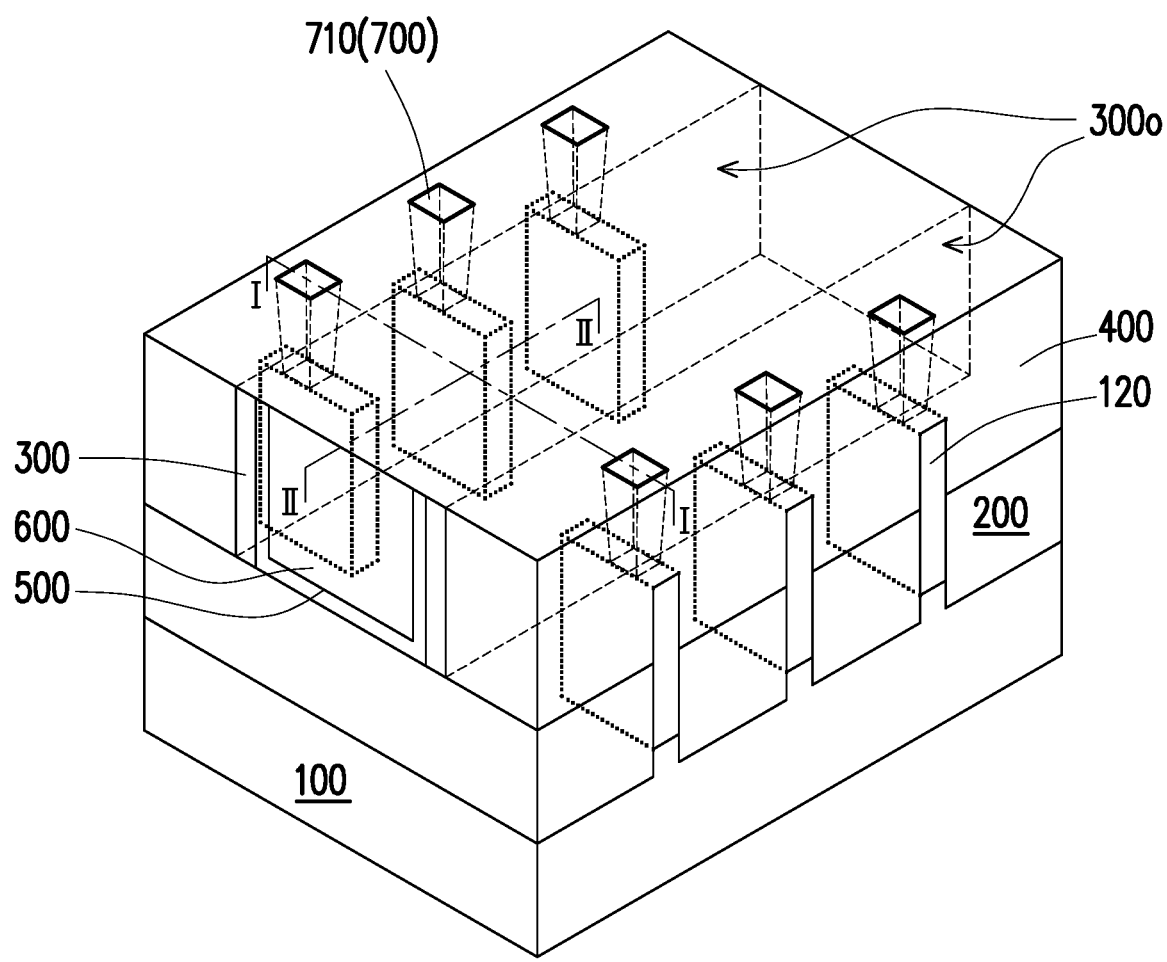
Figure 5B:
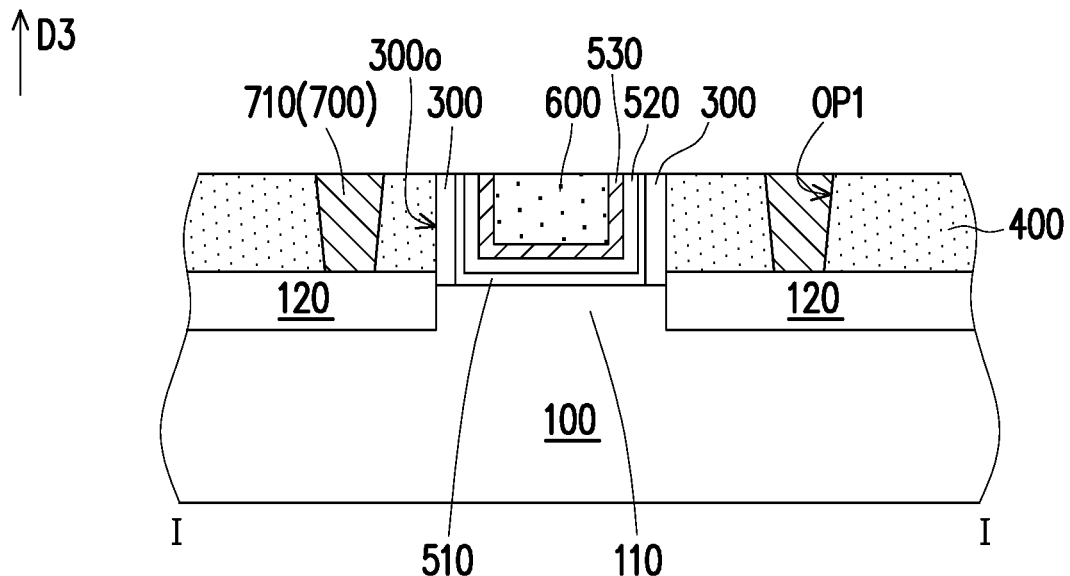
Figure 5C:
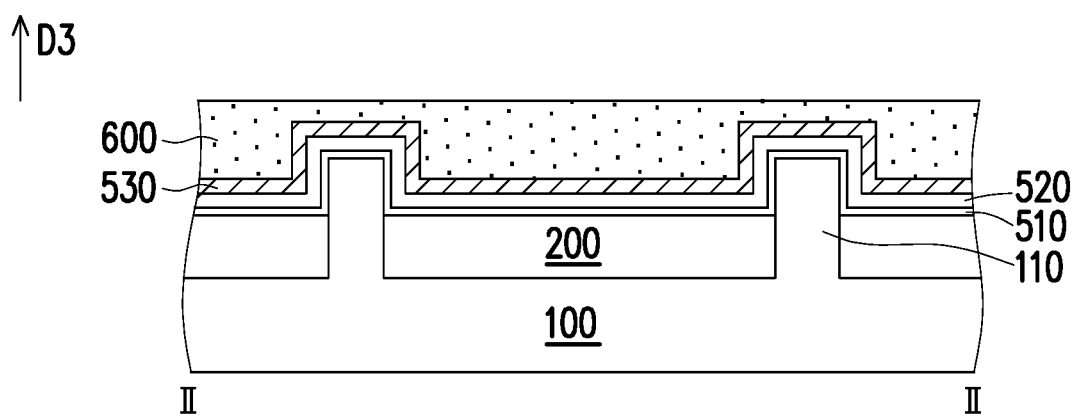

Referring to FIG. 5A to FIG. 5C, one or more contacts or contact portions are formed for connecting the source and drain regions 120. As shown in FIG. 5A and FIG. 5B, bottom portions 710 (bottom parts of source and drains contacts 700) are formed on the source and drain regions 120 through the first interlayer dielectric layer 400. For example, first openings OP1 may be formed via an etching step, in the first interlayer dielectric layer 400, to expose the source and drain regions 120. A conductive material may then be filled within the first openings OP1 to form the bottom portions 710 contacting the top surfaces of the source and drain regions 120. The conductive material of the bottom portions 710 may include cobalt (Co), tungsten (W), copper (Cu), titanium (Ti), tantalum (Ta), aluminum (Al), zirconium (Zr), hafnium (Hf), or other suitable metals. In some embodiments, the conductive material of the bottom portions may be cobalt, tungsten or copper. In some embodiments, the conductive material may be formed by using sputtering, chemical vapor deposition (CVD), physical vapor deposition (PVD), atomic layer deposition (ALD), other deposition techniques, or a combination thereof.

Figure 6A:
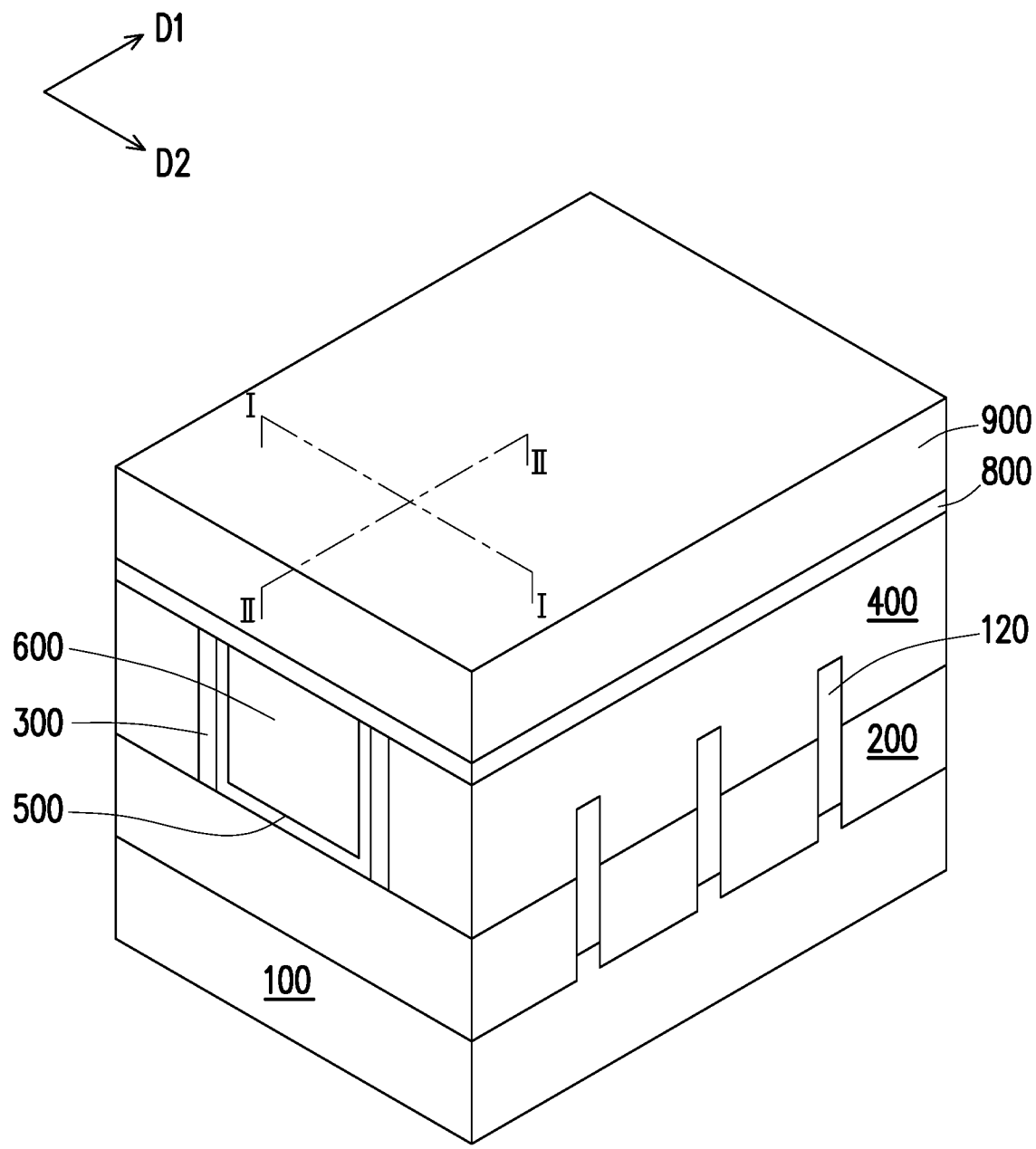
Figure 6B:
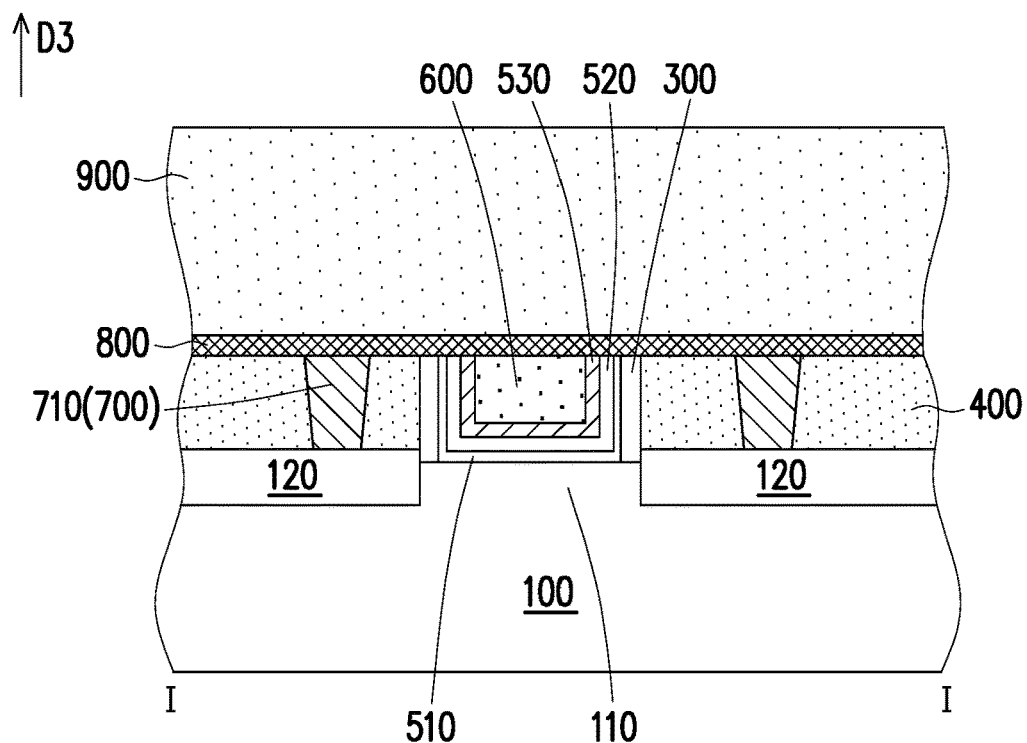
Figure 6C:
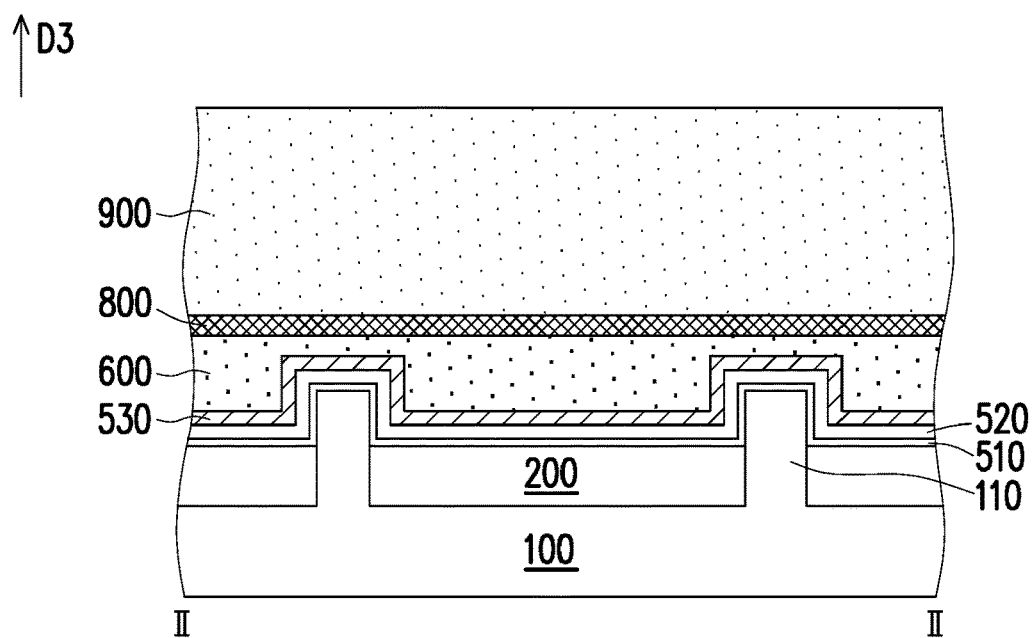

Referring to FIG. 6A to FIG. 6C, an etch stop layer 800 and an insulating layer 900 are formed. In some embodiments, the etch stop layer 800 is formed over the first interlayer dielectric layer 400 and the bottom portions 710 of the source and drain contacts 700. In some embodiments, the etch stop layer 800 extends between the insulating layer 900 and the first interlayer dielectric layer 400 or between the insulating layer 900 and the bottom portions 710 of the source and drain contacts 700. The etch stop layer 800 may comprise a dielectric material such as silicon carbide, silicon nitride, silicon oxynitride, or the like. The etch stop layer 800 may be formed using CVD, ALD, or other applicable deposition methods. The insulating layer 900 may include a low-k dielectric material, and may be formed similarly to what previously described with reference to the first and second interlayer dielectric layers 400 and 600. In some embodiments, a material of the insulating layer 900 may be the same as the material of the first interlayer dielectric layer 400. In some alternative embodiments, the insulating layer 900 and the first interlayer dielectric layer 400 may include different materials.

Figure 7:
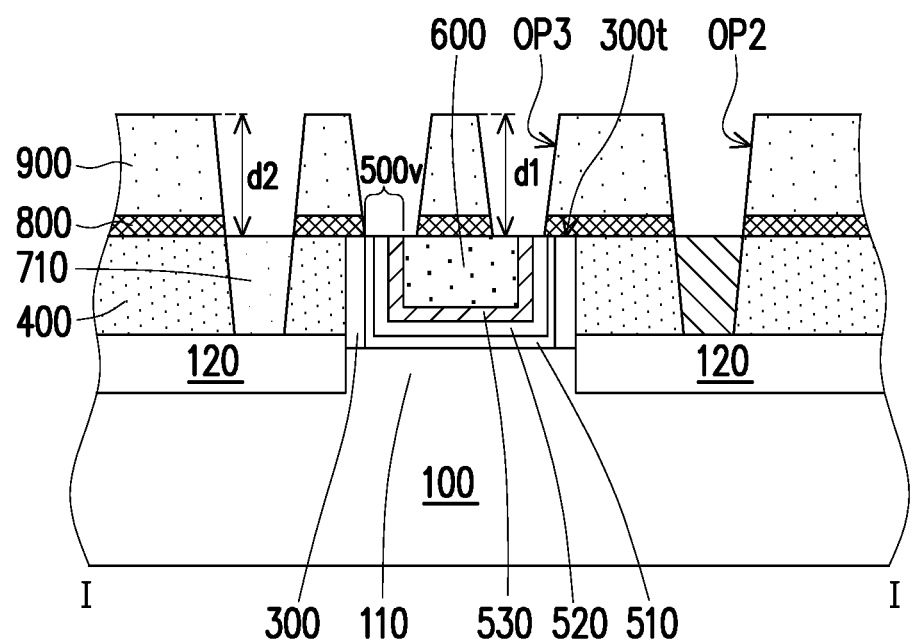
FIG. 7 shows a schematic cross-sectional view of a structure produced during a manufacturing method of a FinFET according to some embodiments of the present disclosure. The cross-sectional view of FIG. 7 is taken along the line I-I of FIG. 1A.
Figure 8A:
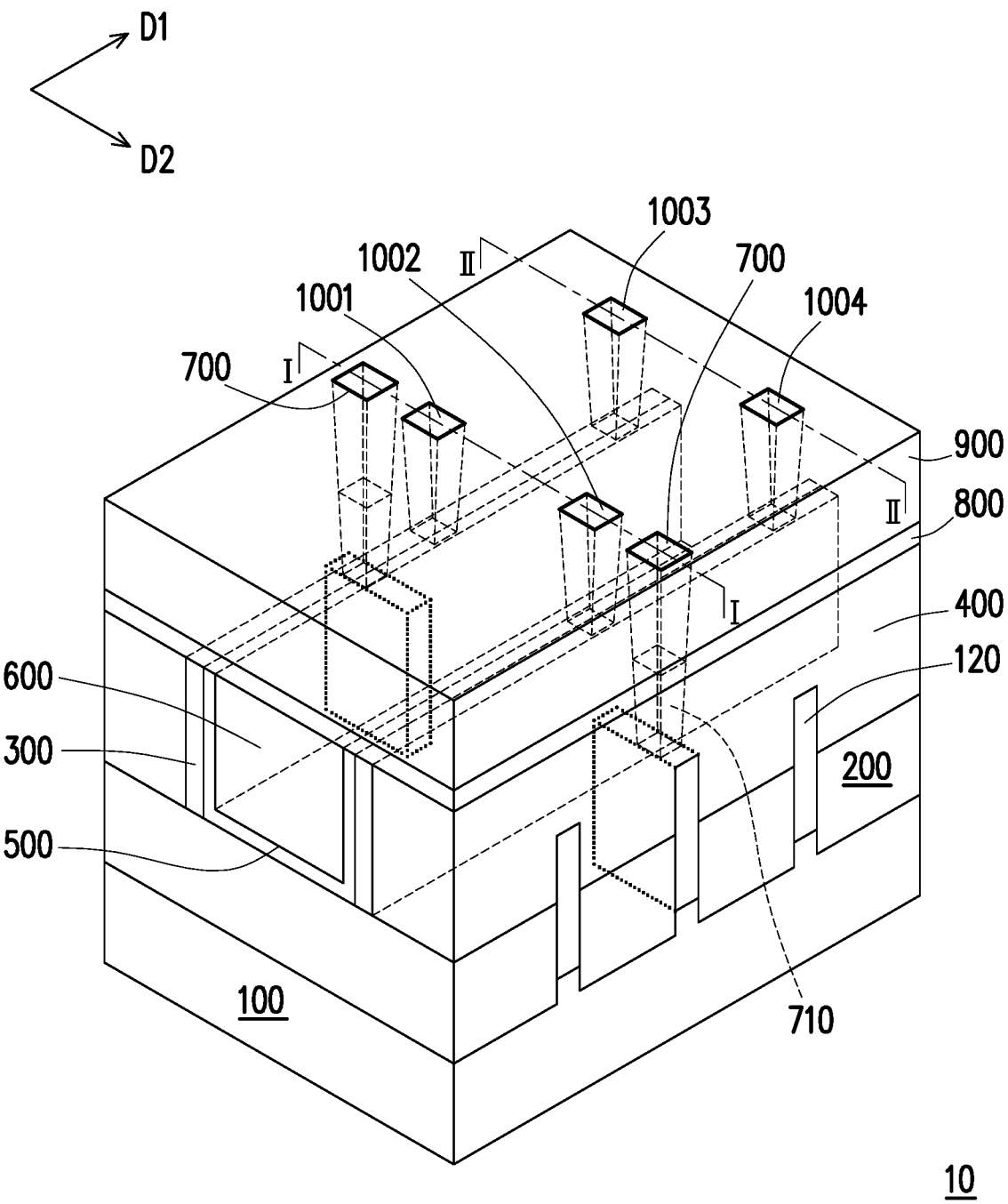
FIG. 8A shows a schematic perspective view of a FinFET according to some embodiments of the present disclosure.

FIG. 7 is a schematic cross-sectional view of a structure produced during a manufacturing method of a FinFET according to some embodiments of the disclosure. The cross-sectional view of FIG. 7 is taken along the line I-I of FIG. 8A, showing the structure prior to the formation of the gate contacts. Referring to FIG. 7, second openings OP2 may be formed in the insulating layer 900 and third openings OP3 may be formed in the insulating layer 900. The bottom of the second openings OP2 exposes the bottom portions 710 of the source and drain contacts 700 previously formed. The third openings OP3 expose at least the gate electrode layer 530 in the region 500v of the gate structure 500 emerging from below the second interlayer dielectric layer 600. In some embodiments, the third openings OP3 further expose other layers of the gate structure 500, portions of one or more spacer 300 or portions of the second interlayer dielectric layer 600. In some embodiments, formation of the second openings OP2 and the third opening OP3 may involve one or more etching steps. In some embodiments, the etching step may include a first etching step removing the insulating layer 900 and a second etching step removing the etch stop layer 800. In some embodiments, during the etching step, the insulating layer 900 is partially removed and the etch stop layer 800 is then removed. That is, the same etching depth is reached during the etching step for the openings either above the source and drain regions 120 or on top of the gate structure 500. As such, the second openings OP2 over the source and drain regions 120 are formed to expose the underlying bottom portions 710 after the etching step. Also, after the etching step, the third openings OP3 are formed by removing the insulating layer 900 and the etch stop layer 800 on top of the gate structure 500, so as to expose the gate electrode layer 530. Due to etch selectivity, the second openings OP2 are not further etched down to damage the bottom portions 710 during the etching step. Also, due to etch selectivity or etching depth control, the gate structure 500 is not damaged during the etching step. As such, a depth d1 of the third openings OP3 is substantially the same as a depth d2 of the second openings OP2. In some embodiments, the third openings OP3 reach the gate structure 500 and the second interlayer dielectric layer 600, and the third openings OP3 expose the gate structure 500 in proximity of the spacers 300. In other words, the third openings OP3 stop at the level defined by the top surfaces 300t of the spacers 300, or, equivalently, at the third height H3 (shown in FIG. 4B) reached by the gate structure 500. That is, the third openings OP3 are formed without removing material from the second interlayer dielectric layer 600. In some embodiments, the third openings OP3 may be referred to as gate contact openings.

Figure 8B:
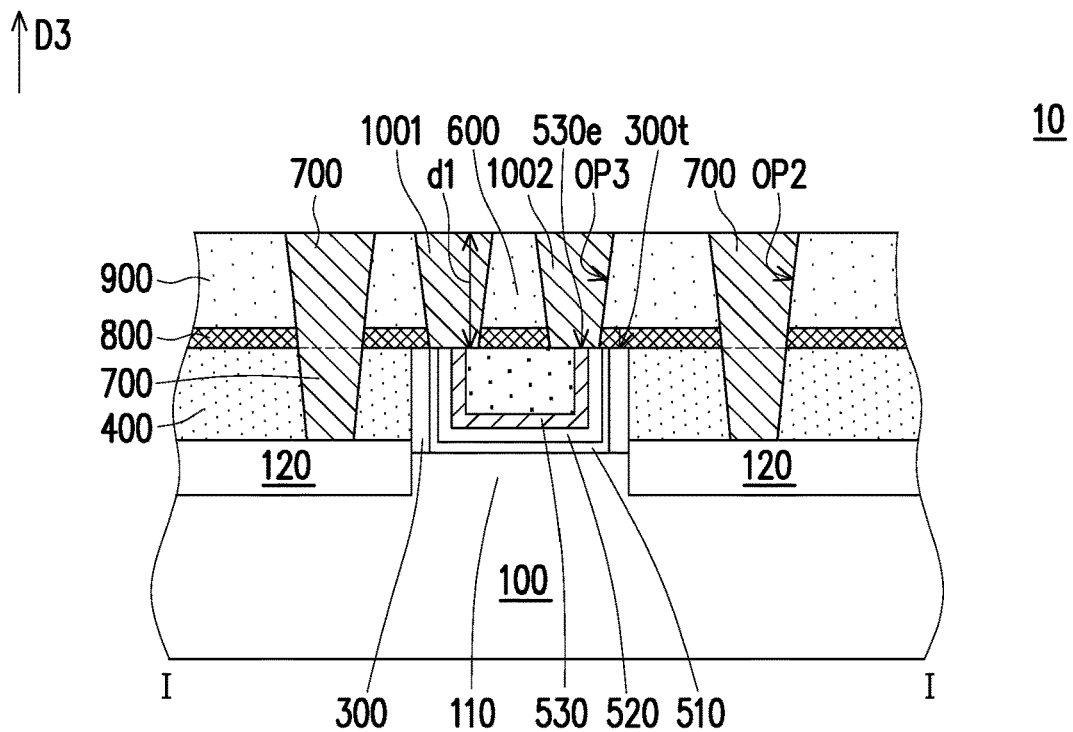
FIG. 8B and FIG. 8C show schematic cross-sectional views of a FinFET according to some embodiments of the present disclosure. The cross-sectional view of FIG. 8B is taken along the line I-I shown in FIG. 8A. The cross-sectional view of FIG. 8C is taken along the line II-II shown in FIG. 8A.
Figure 8C:
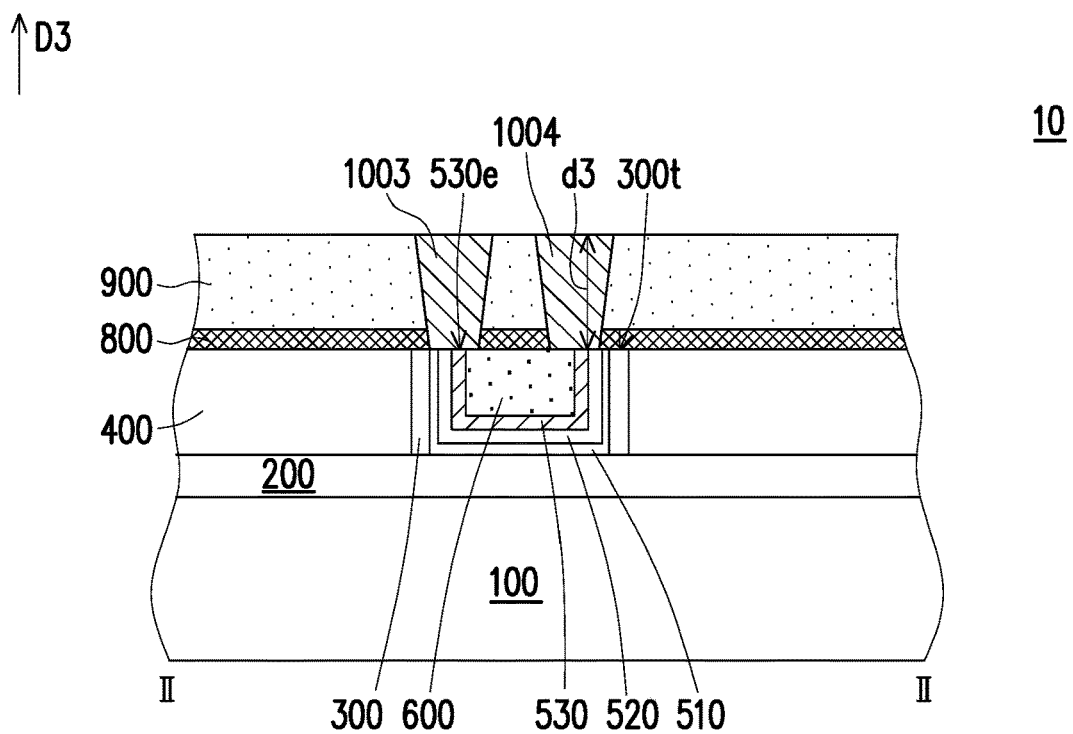

FIG. 8A is a perspective view of the FinFET 10 according to some embodiments of the disclosure. FIG. 8B and FIG. 8C are cross-sectional views of the structure shown in FIG. 8A along the lines I-I and II-II of FIG. 8A, respectively. Referring to FIG. 8A to FIG. 8C, the FinFET 10 may be produced from the structure of FIG. 7 by completing formation of the source and drain contacts 700 and by providing the gate contacts 1001 to 1004. The source and drain contacts 700 may be completed by deposition of a conductive material in the second openings OP2 (shown in FIG. 7) on the bottom portions 710. For clarity purposes, only two bottom portions 710 are shown in FIG. 8A, and the other bottom portions 710 are omitted in the figure. The gate contacts 1001 to 1004 may be formed by depositing a conductive material in the third openings OP3 (shown in FIG. 7). In some embodiments, the conductive material deposited in the third openings OP3 is the same as the conductive material deposited in the second openings OP2. In some embodiments, the same conductive material is deposited to fill the third openings OP3 and the second openings OP2 in the same deposition process. In some embodiments, the conductive material deposited in the second openings OP2 is the same as conductive material used for the bottom portions 710 (shown in FIG. 7) of the source and drain contacts 700. In some alternative embodiments, the conductive material deposited in the second openings OP2 is different than the conductive material of the bottom portions 710.

The cross-sectional view of FIG. 8B is taken along the line I-I of FIG. 8A. The cross-sectional view of FIG. 8C is taken along the line II-II of FIG. 8A. The difference between the lines I-I and II-II in FIG. 8A is that line I-I runs over a fin 110, whilst line II-II runs on an isolation structure 200 not over a fin 110 but in between adjacent fins 110 of the FinFET 10. In some embodiments, the top surfaces 300t of the spacers 300 lie substantially within the same plane. In some embodiments, the gate contacts 1001 to 1004 contact at least the end portion 530e of the gate electrode layer 530. The end portion 530e is substantially flush with the top surfaces 300t of the spacers 300, so that a depth d1 of the gate contacts 1001 and 1002 formed over a fin 110 is about equal to a depth d3 of the gate contacts 1003 and 1004 formed over the isolation structure 200. In some embodiments, the gate contacts 1001 to 1004 penetrate through the insulating layer 900 and the etch stop layer 800, without penetrating into the second interlayer dielectric layer 600. By forming the gate contacts 1001 to 1004 to contact the region 500v (shown in FIG. 4A) of the gate structure 500 extending on the inner sidewall 300i of the spacers 300, the gate contacts 1001 to 1004 may have substantially the same depth at the locations independently of whether the gate contacts 1001 to 1004 overlie the fins 110 or the isolation structures 200.

Figure 8D:
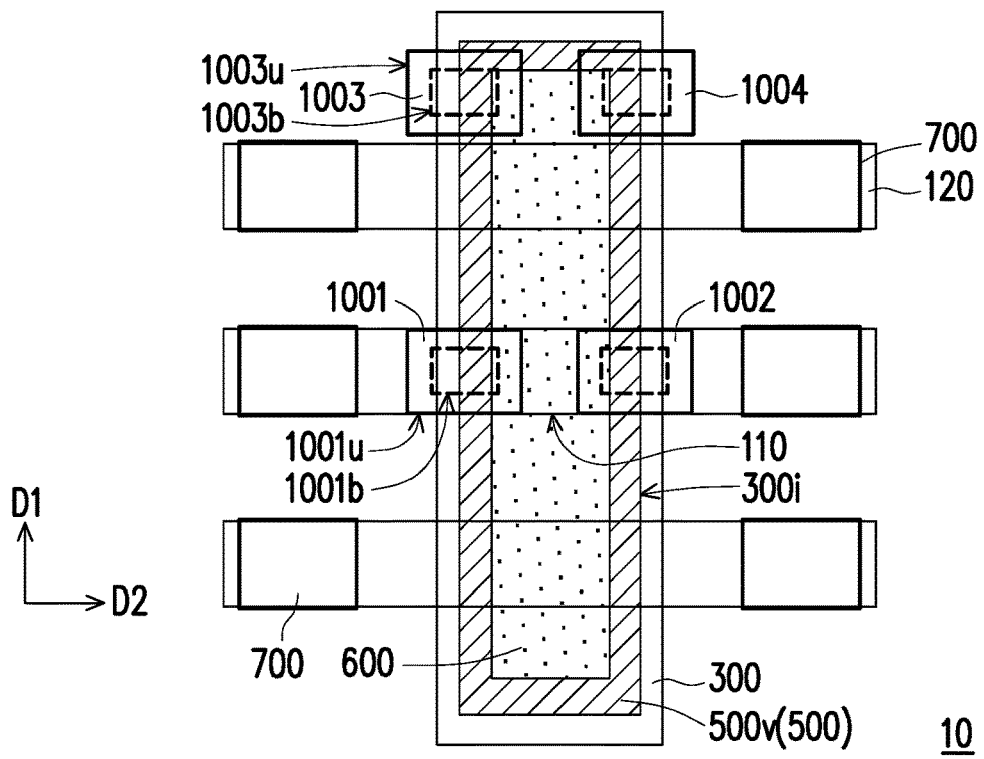
FIG. 8D shows a schematic top view of a FinFET according to some embodiments of the present disclosure.

FIG. 8D is a schematic top view of the FinFET structure 10 shown in FIG. 8A according to some embodiments of the disclosure. In FIG. 8D, in order to show the relative positions of the contacts to the gate structure, certain layers including 400, 800, and 900 are omitted for clarification purposes. Referring to FIG. 8A to FIG. 8D, the FinFET structure 10 is shown to include three fins 110 encircled by the spacer 300. However, the disclosure is not limited thereto, and fewer or more fins 110 may be included according to some alternative embodiments. Source and drain regions 120 are located at opposite ends of each fin 110 along the second direction D2. In some embodiments, the source and drain regions 120 are formed within a portion of the fin 110 that extends beyond the spacer 300. Source and drain contacts 700 are formed on top of the source and drain regions 120. The gate structure 500 is disposed within the enclosure defined by the spacer 300, and has the second interlayer dielectric layer 600 disposed on top. The gate structure 500 emerges from below the second interlayer dielectric layer 600 only along the inner sidewall 300i of the spacer 300. The gate structure 500 is sandwiched between the second interlayer dielectric layer 600 and the spacer 300, and the exposed region 500v including at least the gate electrode layer 530 is sandwiched between the second interlayer dielectric layer 600 and the spacer 300. Gate contacts 1001 to 1004 are formed over the gate structure 500, and establish electrical contact with the gate structure 500 through the exposed region 500v. As shown in FIG. 8D, two gate contacts 1001 and 1002 may reach the gate structure 500 in correspondence of a fin 110, whilst the other two gate contacts 1003 and 1004 may reach the gate structure 500 in correspondence of an isolation structure 200 (from the top view, the regions beside the fins 110 and the source and drain regions 120). However, as discussed with reference to FIG. 8B and FIG. 8C, the respective depths d1 and d3 of the gate contacts 1001 and 1002 extending to reach the gate structure 500 over the fin 110 and the gate contacts 1003 and 1004 extending to reach the gate structure 500 over the isolation structure 200 are substantially equal. That is, the gate contacts 1001 to 1004 may contact the gate structure 500 where the gate structure 500 reaches the third height H3 (shown in FIG. 4B) along the spacers 300. Furthermore, in FIG. 8D are illustrated markings corresponding to the bottom surfaces and the upper surfaces of the gate contacts 1001 to 1004 (labelled as 1001b and 1001u as well as 1003b and 1003u, respectively, only for the gate contacts 1001 and 1003, the labels for the other gate contacts being omitted for clarity). In FIG. 8D (as well as in FIG. 9A through FIG. 9H), the spans of bottom surfaces of the gate contacts 1001 to 1004 are illustrated as dashed lines, and the spans of the upper surfaces of the gate contacts 1001 to 1004 are illustrated as solid lines. In some embodiments, the gate contacts 1001 to 1004 have a tapered vertical profile. That is, for each gate contact 1001 to 1004, a span of the upper surface 1003u may be larger than a span of the bottom surface 1003b. For each gate contact 1001 to 1004, the bottom surface will extend on the exposed region 500v of the gate structure 500, thus establishing contact with the gate electrode layer 530. As such, the bottom surfaces of the gate contacts 1001 to 1004 are substantially coplanar with top surfaces 300t of the spacers 300. In some embodiments, the bottom surface of a gate contact 1001 to 1004 may further extend over the other layers of the gate structure (e.g., the gate dielectric layer 510 or the work function layer 520). In some embodiments, the bottom surface of a gate contact 1001 to 1004 partly extends on the top surface 300t of the spacer 300. In some embodiments, the bottom surface of a gate contact 1001 to 1004 partly extends on the second interlayer dielectric layer 600. In some embodiments, the top surface of a gate contact 1001 to 1004 may extend outside the span covered by the gate structure 500.

In some embodiments, multiple gate contacts 1001 to 1004 allow better control of the gate structure 500. In some embodiments, as the gate contacts 1001 to 1004 do not penetrate into the second interlayer dielectric layer 600, the second interlayer dielectric layer 600 may not need to be removed during an etching step, thus expanding the range of potential materials to use for the second interlayer dielectric layer 600. In some embodiments, the gate contacts 1001 to 1004 are shorter than they would be were the contact with gate structure 500 be established by crossing through the second interlayer dielectric layer 600, resulting in a simplified manufacturing process. In some embodiments, having the gate contacts 1001 to 1004 not extending through the second interlayer dielectric layer 500 reduces stress experienced by the FinFET 10 during manufacturing or operation. As such, stress release structures such as dummy fins may be omitted, further simplifying the manufacturing process. However, the disclosure is not limited thereto. In some alternative embodiments, stress dissipation structures such as dummy fins may be included in the FinFET 10. Furthermore, provided the gate contacts 1001 to 1004 reach the gate electrode layer 530 of the gate structure 500, the position of the gate contacts 1001 to 1004 may be varied along the gate structure 500 according to production and design requirements.

Figure 9A:
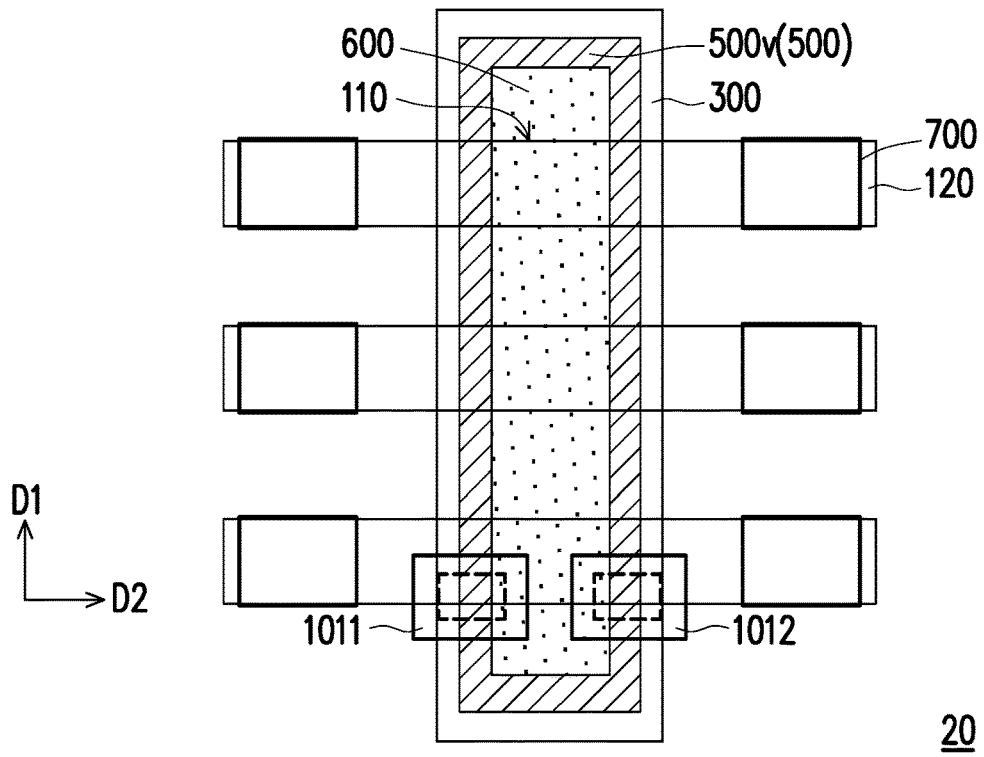
FIG. 9A to FIG. 9H show schematic top-views of FinFETs according to some embodiments of the present disclosure.
Figure 9B:
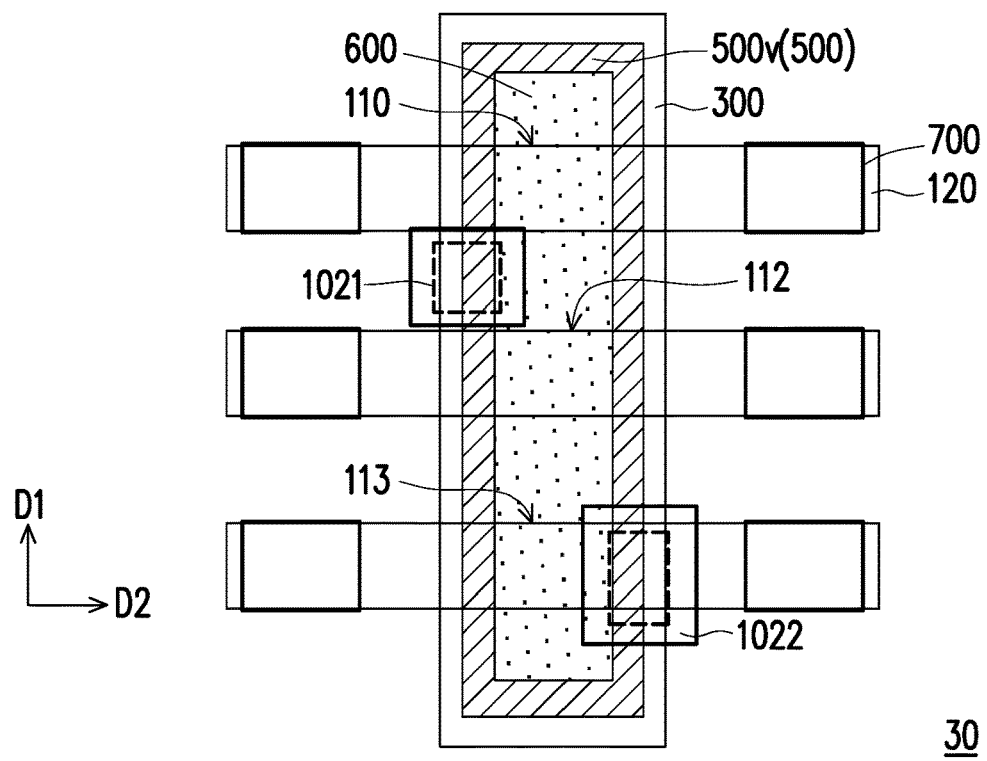
Figure 9C:
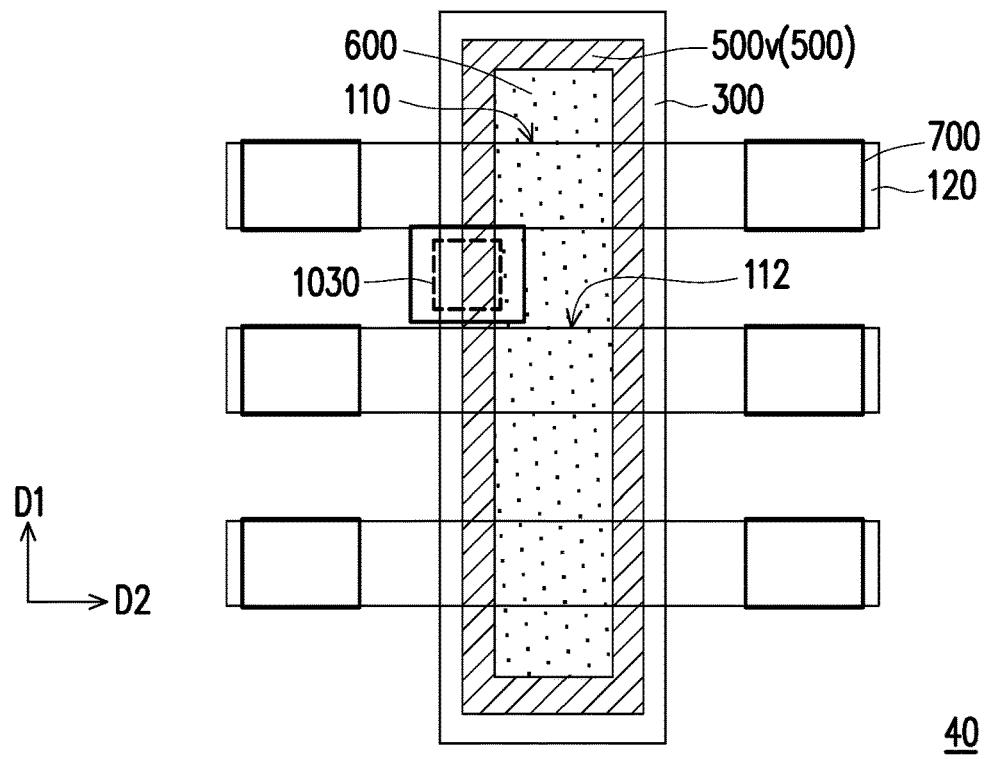
Figure 9D:
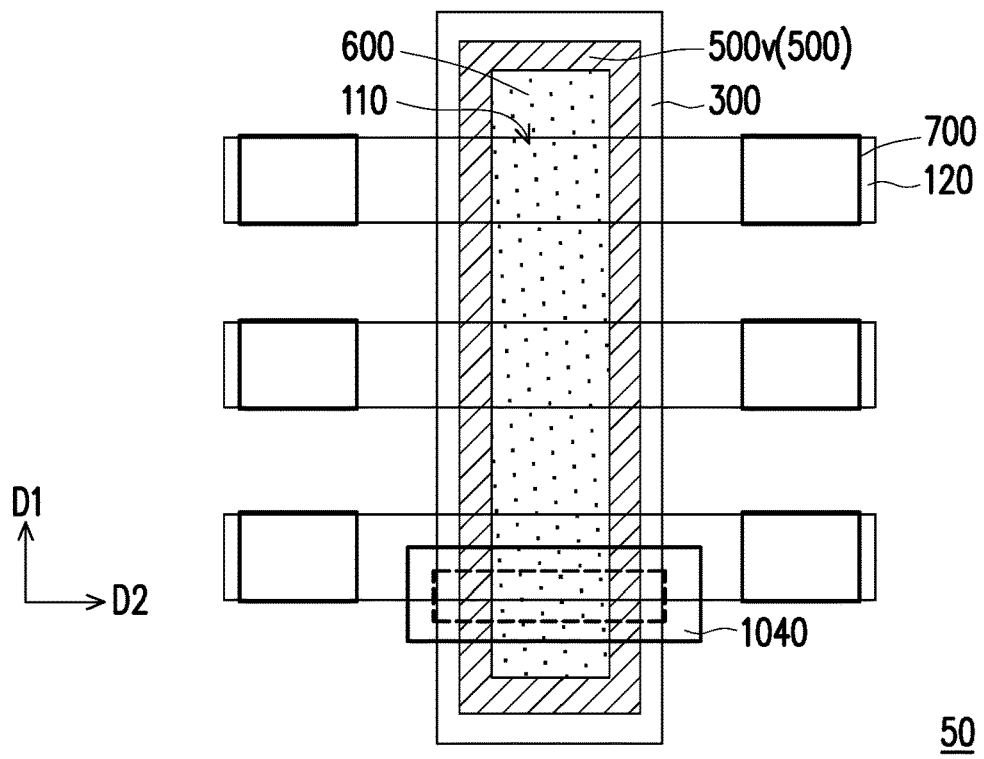
Figure 9E:
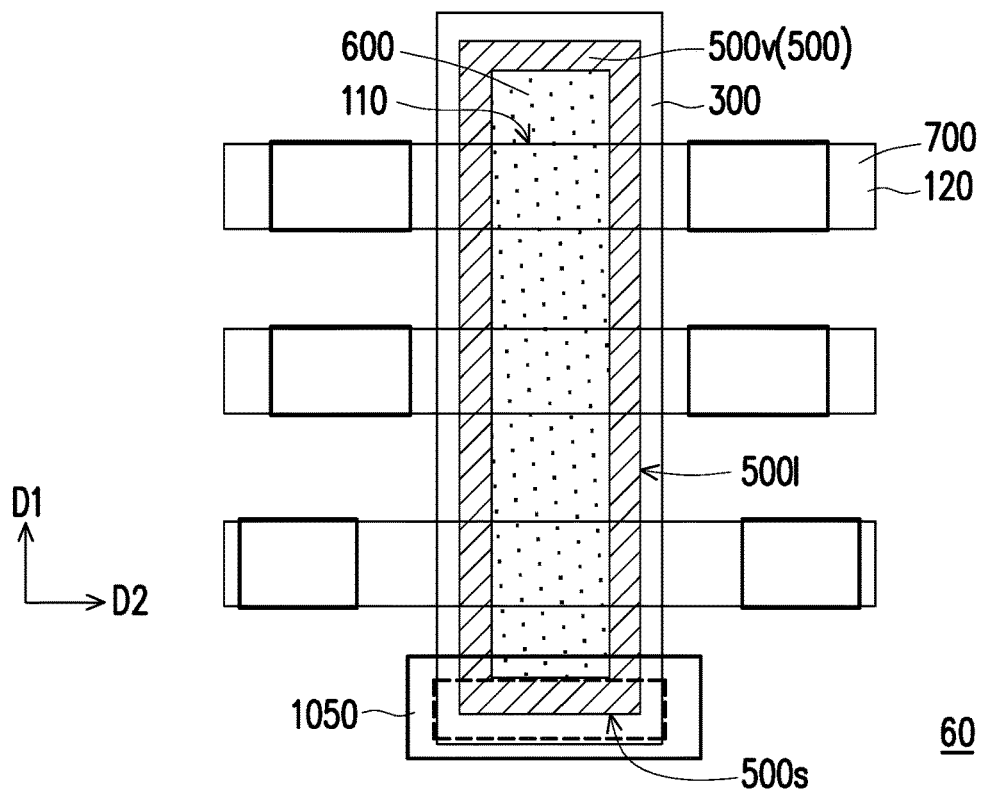
Figure 9F:
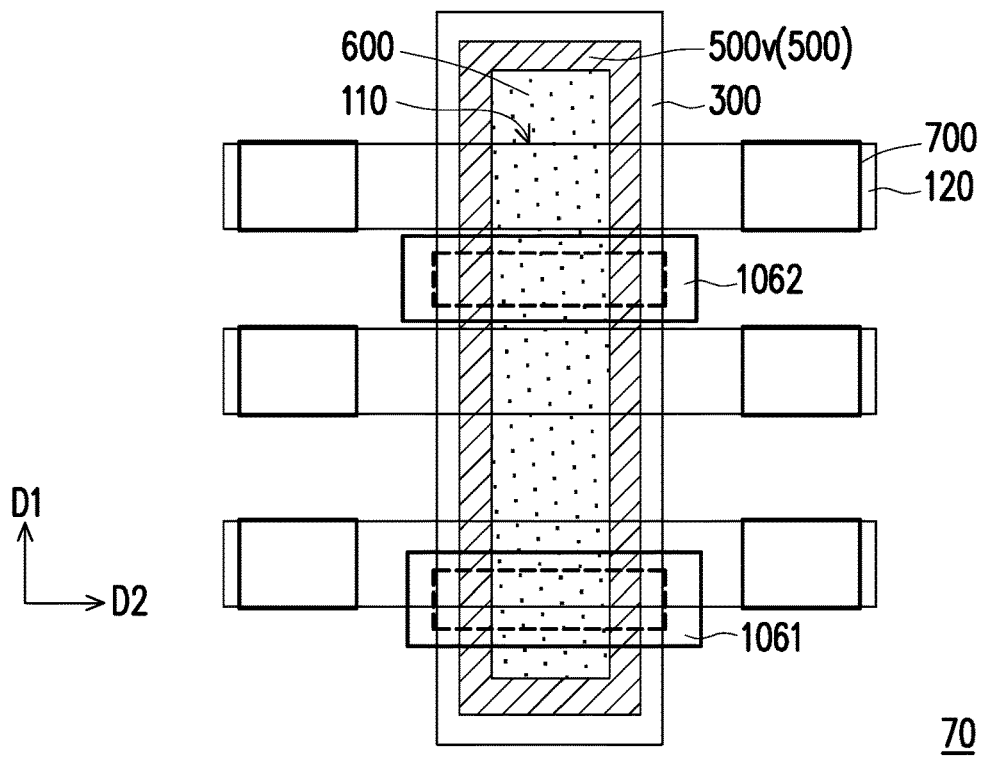
Figure 9G:
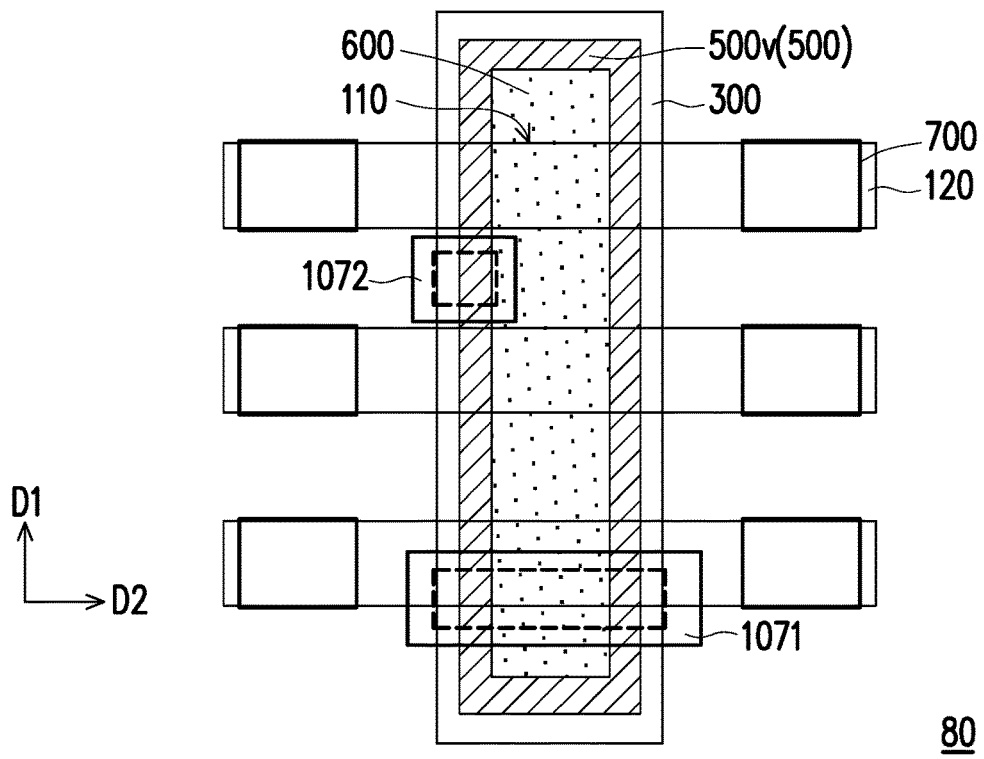
Figure 9H:
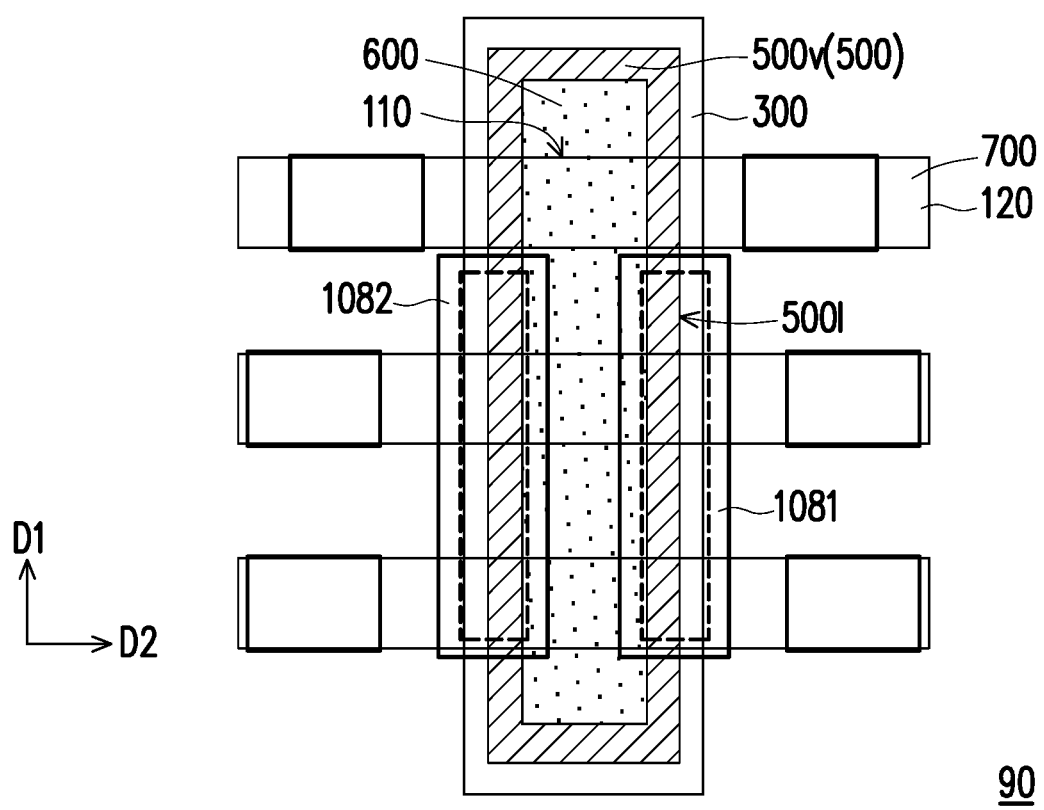

In FIG. 9A is shown a schematic top view of a FinFET 20 according to some embodiments of the disclosure. A difference between the FinFET 20 of FIG. 9A with the FinFET 10 of FIG. 8A to FIG. 8B is that only two gate contacts 1011 and 1012 are formed. In the FinFET 20 of FIG. 9A, the two gate contacts 1011 and 1012 are located over the same fin 110 on opposite sides of the gate structure 500, and have similar shapes. However, the present disclosure is not limited with respect to any of these features. As shown in FIG. 9B, in the FinFET 30, a first gate contact 1021 is located in between fins 111 and 112 over an isolation structure (not illustrated in FIG. 9B, similar configuration to what shown in FIG. 8C), whilst a second gate contact 1022 is located over a third fin 113. According to some other embodiments, in a FinFET 40 a single gate contact 1030 is formed, as shown in FIG. 9C. Whilst the gate contact 1030 is shown disposed in between fins 110, in some alternative embodiments the gate contact 1030 may be disposed over one of the fins 110. In FIG. 9D is shown a schematic top view of a FinFET 50 according to some embodiments of the disclosure. A difference between the FinFET 50 of FIG. 9D and the FinFET 40 of FIG. 9C is that the gate contact 1040 has an elongated shape in the second direction D2, extending over an entire fin 110 along the second direction D2. In some embodiments, as shown in FIG. 9D, the gate contact 1040 may mostly extend over the second interlayer dielectric layer 600, even though still contacting the gate structure 500 in one or more points. In some alternative embodiments, the gate contact 1050 of a FinFET 60 extends over a short edge 500s of the gate structure 500, as shown in FIG. 9E. In some embodiments, the short edge 500s extends parallel to the fins 110 along the second direction D2, and connects two long edges 5001 of the gate structure 500. The long edges 5001 of the gate structure 500 may extend perpendicular to the fins 110 along the first direction D1. According to some embodiments of the disclosure, as shown in FIG. 9F, in a FinFET 70 both gate contacts 1061 and 1062 extend across the gate structure 500 along the second direction D2. In some embodiments, the gate contacts 1061 and 1062 extend parallel to each other. In some alternative embodiments, as shown in FIG. 9G, the gate contacts 1071 and 1072 may have different shapes, the first gate contact 1071 being elongated (for example, along the second direction D2), whilst the second gate contact 1072 has a less stretched shape (for example, of a truncated pyramid with square base). Whilst in FIG. 9D to FIG. 9G the elongate gate contacts were shown to extend along the second direction D2, the disclosure is not limited thereto. In some embodiments, shown in FIG. 9H, a FinFET 90 includes one or more gate contacts 1081, 1082 extending in the first direction D1. In some embodiments, the gate contacts 1081, 1082 extends over the long edges 5001 of the gate structure 500. In some embodiments, the gate contacts 1081, 1082 extending along the first direction D1 extend over multiple fins 110.

According to some embodiments, a field effect transistor includes a substrate, a fin, spacers, a gate structure, a hard mask pattern, an insulating layer, and a gate contact. The fin protrudes from the substrate and extends in a first direction. The spacers run in parallel over the fin and extending in a second direction perpendicular to the first direction. The gate structure extends between the spacers and covers the fin. The hard mask pattern covers the gate structure and extends in between the spacers. The insulating layer is disposed over the substrate and covers the hard mask pattern, the gate structure and the spacers. The gate contact penetrates the insulating layer and physically contacts the gate structure. A bottom surface of the gate contact is coplanar with top surfaces of the spacers and the hard mask pattern.

According to some embodiments, a field effect transistor includes a substrate, fins, isolation structures, a spacer structure, a gate structure, a dielectric layer, and a first gate contact. The fins are arranged in parallel over the substrate along a first direction. Each fin extends along a second direction perpendicular to the first direction. The isolation structures are disposed between adjacent fins. The spacer structure defines an enclosure surrounding the fins and portions of the isolation structures. The gate structure is disposed within the enclosure over the fins and the isolation structures. The dielectric layer is entrenched within the gate structure. The source and drain regions are disposed at opposite sides of the gate structure. The first gate contact is disposed on the gate structure and in contact with a top surface of the gate structure, and the top surface of the gate structure is levelled with top surfaces of the dielectric layer and the spacer structure.

According to some embodiments, a method of manufacturing a field effect transistor includes at least the following steps. Fins are formed over a substrate and isolation structures are formed between the adjacent fins. Spacers are formed to define an enclosure exposing the fins and the isolation structures disposed in between. A gate blanket structure is formed in the enclosure and over the spacers. A first interlayer dielectric layer is formed over the gate blanket structure. A planarization process is performed to form a gate structure and a planarized first interlayer dielectric layer entrenched in the gate structure. A gate contact is formed physically contacting a top surface of the gate structure without penetrating into the planarized first interlayer dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A field effect transistor, comprising:
a substrate;
a fin protruding from the substrate and extending in a first direction;
spacers, running in parallel over the fin and extending in a second direction perpendicular to the first direction;
a gate structure, extending in between the spacers and covering the fin;
a hard mask pattern, covering the gate structure and extending in between the spacers;
an insulating layer, disposed over the substrate and covering the hard mask pattern, the gate structure and the spacers; and
a gate contact, penetrating through the insulating layer and physically contacting the gate structure,
wherein a bottom surface of the gate contact is coplanar with top surfaces of the spacers and the hard mask pattern,
wherein the gate contact physically contacts at least a portion of the gate structure extending directly on an inner sidewall of the spacers, and the portion of the gate structure physically contacts, at a level height of the bottom surface of the gate contact, the hard mask pattern at one side and the inner sidewall of the spacers at an opposite side.

2. The field effect transistor of claim 1, wherein the portion of the gate structure contacted by the gate contact comprises a portion of a top surface of the gate structure, and a side surface of the gate structure contiguous with the top surface is covered by the hard mask pattern.

3. The field effect transistor of claim 1, further comprising isolation structures disposed between the spacers along opposite sides of the fin and extending in the first direction, wherein a span of a top surface of the gate contact falls over an isolation structure.

4. The field effect transistor of claim 3, wherein the span of the top surface of the gate contact falls over the isolation structure and the fin.

5. The field effect transistor of claim 1, wherein a span of a top surface of the gate contact falls over the fin.

6. The field effect transistor of claim 1, wherein a bottom surface of the gate contact physically contacts the gate structure and the hard mask pattern.

7. The field effect transistor of claim 1, wherein a bottom surface of the gate contact physically contacts the gate structure and the spacer.

8. The field effect transistor of claim 1, wherein the gate structure is sandwiched between the spacers and the hard mask pattern, and the gate contact extends in the first direction over the spacers, the gate structure and the hard mask pattern.

9. A field effect transistor, comprising:
a substrate;
fins, arranged in parallel over the substrate along a first direction, each fin extending along a second direction perpendicular to the first direction;
isolation structures, disposed between the adjacent fins;
a spacer structure, defining an enclosure surrounding the fins and portions of the isolation structures;
a gate structure, disposed within the enclosure over the fins and the isolation structures and comprising a gate electrode layer;
source and drain regions, disposed at opposite sides of the gate structure;
a dielectric layer entrenched within the gate electrode layer; and
a first gate contact, disposed on the gate structure and in contact with a top surface of the gate structure, wherein a region of the top surface of the gate structure contacted by the first gate contact is levelled with top surfaces of the dielectric layer and the spacer structure.

10. The field effect transistor of claim 9, wherein the first gate contact extends over more than one fin along the first direction.

11. The field effect transistor of claim 9, further comprising a second gate contact disposed on the gate structure and in contact with the top surface, wherein a depth of the first gate contact is substantially equivalent to a depth of the second gate contact.

12. The field effect transistor of claim 11, wherein the first gate contact contacts a portion of the gate structure over the fin, and the second gate contact contacts a portion of the gate structure over the isolation structure.

13. The field effect transistor of claim 11, wherein the first gate contact and the second gate contact have an elongated shape and extend parallel with respect to each other.

14. The field effect transistor of claim 11, wherein the first gate contact and the second gate contact have different shapes.

15. The field effect transistor of claim 11, wherein the first gate contact and the second gate contact respectively reach different portions of the gate structure over different fins.

16. The field effect transistor of claim 9, wherein a bottom surface of the first gate contact is in contact with the top surface of the dielectric layer.

17. A field effect transistor, comprising:
a substrate;
a fin protruding from the substrate and extending in a first direction;
spacers, running in parallel over the fin and extending in a second direction perpendicular to the first direction;
a gate structure, extending in between the spacers and covering the fin, the gate structure comprising a gate dielectric layer, a work function layer and a gate electrode sequentially stacked;
a hard mask pattern, laterally encircled by the gate electrode;
an insulating layer, disposed over the substrate and covering the hard mask pattern, the gate structure and the spacers; and
a gate contact, penetrating through the insulating layer and physically contacting the gate structure,
wherein a bottom surface of the gate contact extends on the work function layer at a same level height than top surfaces of the spacers and a top surface of the hard mask pattern.

18. The field effect transistor of claim 17, wherein the gate dielectric layer extends on inner sidewalls of the spacers.

19. The field effect transistor of claim 17, further comprising an etch stop layer extending between the hard mask pattern and the insulating layer, wherein the gate contact further extends through the etch stop layer to physically contact the gate structure.

20. The field effect transistor of claim 17, wherein the gate structure separates the hard mask pattern from the spacers.

* * * * *